United States Patent
Rehmeyer et al.

(10) Patent No.: US 11,610,622 B2
(45) Date of Patent: Mar. 21, 2023

(54) APPARATUSES AND METHODS FOR STAGGERED TIMING OF SKIPPED REFRESH OPERATIONS

(71) Applicant: Micron Technology, Inc., Boise, ID (US)

(72) Inventors: James S. Rehmeyer, Boise, ID (US); Nathaniel J. Meier, Boise, ID (US); Joo-Sang Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/226,975

(22) Filed: Apr. 9, 2021

(65) Prior Publication Data

US 2021/0225431 A1     Jul. 22, 2021

Related U.S. Application Data

(63) Continuation of application No. 16/432,604, filed on Jun. 5, 2019, now Pat. No. 10,978,132.

(51) Int. Cl.
*G11C 11/00*     (2006.01)
*G11C 11/406*     (2006.01)
*H01L 25/065*     (2023.01)

(52) U.S. Cl.
CPC .... *G11C 11/40603* (2013.01); *H01L 25/0657* (2013.01); *H01L 2225/0651* (2013.01);
(Continued)

(58) Field of Classification Search
CPC ......... G11C 11/40611; G11C 11/40618; G11C 11/40615; G11C 11/4076; G11C 11/4087;
(Continued)

(56) References Cited

U.S. PATENT DOCUMENTS

| 5,654,929 A | 8/1997 | Mote, Jr. |
| 5,867,442 A | 2/1999 | Kim et al. |

(Continued)

FOREIGN PATENT DOCUMENTS

| CN | 104350546 A | 2/2015 |
| CN | 106710621 A | 5/2017 |

(Continued)

OTHER PUBLICATIONS

International Search Report and Written Opinion for Application No. PCT/US2020/036133, dated Sep. 11, 2020.
(Continued)

*Primary Examiner* — Thong Q Le
(74) *Attorney, Agent, or Firm* — Dorsey & Whitney LLP

(57) ABSTRACT

Embodiments of the disclosure are drawn to apparatuses and methods for staggering the timing of skipped refresh operations on a memory. Memory cells of memories may need to periodically perform refresh operations. In some instances, auto-refresh operations may be periodically skipped when charge retention characteristics of the memory cells of the memory exceed the auto-refresh frequency. To reduce peak current draw during refresh operations, the skipped refresh operations may be staggered across different portions of the memory. In one example, the skipped refresh operation may be staggered in time among memory dies of the memory to limit a number of memory dies that are performing an auto-refresh operation to a maximum number. In another example, the skipped refresh operation may be staggered in time among memory banks of a single memory array to limit a number of memory banks that are performing an auto-refresh operation to a maximum number.

21 Claims, 9 Drawing Sheets

(52) U.S. Cl.
CPC .......... *H01L 2225/06506* (2013.01); *H01L 2225/06562* (2013.01)

(58) Field of Classification Search
CPC .......... G11C 11/40603; G11C 11/4078; G11C 5/025; G11C 5/04; G11C 2211/4061; G11C 11/408; G11C 2211/4065; G11C 11/40622; G11C 16/105; G11C 16/3436; G11C 5/02; G11C 11/4085; G11C 11/4096; G11C 16/3431; G11C 16/349; G11C 2211/406; G11C 29/20; G11C 29/702; G11C 7/00; G11C 7/1039; G11C 7/222; G11C 7/24; G11C 8/12
USPC .......... 365/222, 194, 230.03, 149, 236, 203, 365/233.1, 150, 174, 178, 182, 205, 207, 365/208, 223, 227, 230.08, 233.14, 365/185.25, 195, 233.5
See application file for complete search history.

(56) References Cited

U.S. PATENT DOCUMENTS

| | | |
|---|---|---|
| 5,956,288 A | 9/1999 | Bermingham et al. |
| 5,959,923 A | 9/1999 | Matteson et al. |
| 5,999,471 A | 12/1999 | Choi |
| 6,002,629 A | 12/1999 | Kim et al. |
| 6,064,621 A | 5/2000 | Tanizaki et al. |
| 6,306,721 B1 | 10/2001 | Teo et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,535,950 B1 | 3/2003 | Funyu et al. |
| 7,002,868 B2 | 2/2006 | Takahashi |
| 7,082,070 B2 | 7/2006 | Hong |
| 7,203,113 B2 | 4/2007 | Takahashi et al. |
| 7,565,479 B2 | 7/2009 | Best et al. |
| 7,692,993 B2 | 4/2010 | Iida et al. |
| 8,174,921 B2 | 5/2012 | Kim et al. |
| 8,400,805 B2 | 3/2013 | Yoko |
| 8,572,423 B1 | 10/2013 | Isachar et al. |
| 8,756,368 B2 | 6/2014 | Best et al. |
| 9,076,499 B2 | 7/2015 | Schoenborn et al. |
| 9,190,137 B2 | 11/2015 | Kim et al. |
| 9,236,110 B2 | 1/2016 | Bains et al. |
| 9,251,885 B2 | 2/2016 | Greenfield et al. |
| 9,299,400 B2 | 3/2016 | Bains et al. |
| 9,311,984 B1 | 4/2016 | Hong et al. |
| 9,390,782 B2 | 7/2016 | Best et al. |
| 9,396,786 B2 | 7/2016 | Yoon et al. |
| 9,406,358 B1 | 8/2016 | Lee |
| 9,418,723 B2 | 8/2016 | Chishti et al. |
| 9,570,201 B2 | 2/2017 | Morgan et al. |
| 9,653,139 B1 | 5/2017 | Park |
| 9,685,240 B1 | 6/2017 | Park |
| 9,691,466 B1 | 6/2017 | Kim |
| 9,734,887 B1 | 8/2017 | Tavva |
| 9,761,297 B1 | 9/2017 | Tomishima |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,328 B1 | 1/2018 | Desimone et al. |
| 9,978,430 B2 | 5/2018 | Seo et al. |
| 10,020,045 B2 | 7/2018 | Riho |
| 10,020,046 B1 | 7/2018 | Uemura |
| 10,049,716 B2 | 8/2018 | Proebsting |
| 10,090,038 B2 | 10/2018 | Shin |
| 10,141,042 B1 | 11/2018 | Richter |
| 10,192,608 B2 | 1/2019 | Morgan |
| 10,297,307 B1 | 5/2019 | Raad et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 * | 6/2020 | Brown ................ G11C 7/1039 |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,348,631 B2 | 5/2022 | Wu et al. |
| 11,380,382 B2 | 7/2022 | Zhang et al. |
| 11,417,383 B2 | 8/2022 | Jenkinson et al. |
| 2002/0026613 A1 | 2/2002 | Niiro |
| 2002/0191467 A1 | 12/2002 | Matsumoto et al. |
| 2003/0026161 A1 | 2/2003 | Yamaguchi et al. |
| 2003/0081483 A1 | 5/2003 | De et al. |
| 2003/0161208 A1 | 8/2003 | Nakashima et al. |
| 2003/0231540 A1 | 12/2003 | Lazar et al. |
| 2004/0024955 A1 | 2/2004 | Patel |
| 2005/0002268 A1 | 1/2005 | Otsuka et al. |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0104139 A1 | 5/2006 | Hur et al. |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262617 A1 | 11/2006 | Lee |
| 2006/0268643 A1 | 11/2006 | Schreck et al. |
| 2007/0002651 A1 | 1/2007 | Lee |
| 2007/0014175 A1 | 1/2007 | Min et al. |
| 2007/0028068 A1 | 2/2007 | Golding et al. |
| 2007/0033339 A1 | 2/2007 | Best et al. |
| 2007/0147154 A1 | 6/2007 | Lee |
| 2007/0263442 A1 | 11/2007 | Cornwell et al. |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0270683 A1 | 10/2008 | Barth et al. |
| 2008/0306723 A1 | 12/2008 | De et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0228739 A1 | 9/2009 | Cohen et al. |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0097870 A1 | 4/2010 | Kim et al. |
| 2010/0124138 A1 | 5/2010 | Lee et al. |
| 2010/0128547 A1 | 5/2010 | Kagami |
| 2010/0141309 A1 | 6/2010 | Lee |

(56) References Cited

U.S. PATENT DOCUMENTS

| | | |
|---|---|---|
| 2010/0182862 A1 | 7/2010 | Teramoto |
| 2010/0182863 A1 | 7/2010 | Fukiage |
| 2011/0055495 A1 | 3/2011 | Remaklus, Jr. et al. |
| 2011/0134715 A1 | 6/2011 | Norman |
| 2011/0225355 A1 | 9/2011 | Kajigaya |
| 2011/0299352 A1 | 12/2011 | Fujishiro et al. |
| 2012/0014199 A1 | 1/2012 | Narui |
| 2012/0155173 A1 | 6/2012 | Lee et al. |
| 2012/0155206 A1 | 6/2012 | Kodama et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2014/0006700 A1 | 1/2014 | Schaefer et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0089758 A1 | 3/2014 | Kwok et al. |
| 2014/0095780 A1 | 4/2014 | Bains et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0078112 A1 | 3/2015 | Huang |
| 2015/0085564 A1 | 3/2015 | Yoon et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0356048 A1 | 12/2015 | King |
| 2015/0380073 A1 | 12/2015 | Joo et al. |
| 2016/0027498 A1 | 1/2016 | Ware et al. |
| 2016/0070483 A1 | 3/2016 | Yoon et al. |
| 2016/0078846 A1 | 3/2016 | Liu et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0221546 A1 | 8/2017 | Loh et al. |
| 2017/0269861 A1 | 9/2017 | Lu et al. |
| 2017/0287547 A1 | 10/2017 | Ito et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0043558 A1 | 2/2019 | Suh et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0161341 A1 | 5/2019 | Howe |
| 2019/0190341 A1 | 6/2019 | Beisele et al. |
| 2019/0196730 A1 | 6/2019 | Imran |
| 2019/0205253 A1 | 7/2019 | Roberts |
| 2019/0252020 A1 | 8/2019 | Rios et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |
| 2019/0348102 A1 | 11/2019 | Smith et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |

(56) References Cited

U.S. PATENT DOCUMENTS

| | | |
|---|---|---|
| 2020/0185026 A1 | 6/2020 | Yun et al. |
| 2020/0194056 A1 | 6/2020 | Sakurai et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0304813 A1 | 9/2021 | Cowles et al. |
| 2021/0335411 A1 | 10/2021 | Wu et al. |
| 2021/0406170 A1 | 12/2021 | Jung et al. |
| 2022/0059153 A1 | 2/2022 | Zhang et al. |
| 2022/0059158 A1 | 2/2022 | Wu et al. |
| 2022/0093165 A1 | 3/2022 | Mitsubori et al. |
| 2022/0165328 A1 | 5/2022 | Ishikawa et al. |
| 2022/0189539 A1 | 6/2022 | Li et al. |
| 2022/0199144 A1 | 6/2022 | Roberts |
| 2022/0270670 A1 | 8/2022 | Wu et al. |

FOREIGN PATENT DOCUMENTS

| | | |
|---|---|---|
| CN | 107871516 A | 4/2018 |
| JP | 4911510 B2 | 1/2012 |
| JP | 6281030 B1 | 1/2018 |
| WO | 2019222960 A1 | 11/2019 |
| WO | 2020010010 A1 | 1/2020 |

OTHER PUBLICATIONS

U.S. Appl. No. 16/788,657, titled "Semiconductor Device Performing Row Hammer Refresh Operation", filed Feb. 12, 2020.
U.S. Appl. No. 17/324,621 titled "Apparatuses And Methods for Pure-Time, Self-Adopt Sampling For Row Hammer Refresh Sampling", filed May 19, 2021.
U.S. Appl. No. 16/427,105 titled "Apparatuses And Methods For Priority Targeted Refresh Operations", filed May 30, 2019.
U.S. Appl. No. 16/537,981 titled "Apparatuses and Methods for Controlling Targeted Refresh Rates", filed Aug. 12, 2019.
U.S. Appl. No. 16/994,338 titled "Apparatuses, Systems, and Methods for Memory Directed Access Pause", filed Aug. 14, 2020.
U.S. Appl. No. 16/997,766 titled "Refresh Logic Circuit Layouts Thereof", filed Aug. 19, 2020.
U.S. Appl. No. 16/997,659 titled "Apparatuses, Systems, and Methods for Refresh Modes", filed Aug. 19, 2020.
U.S. Appl. No. 17/095,978 titled "Apparatuses and Methods for Controlling Refresh Timing", filed Nov. 12, 2020.
U.S. Appl. No. 17/127,654 titled "Apparatuses and Methods for Row Hammer Based Cache Lockdown", filed Dec. 18, 2020.
U.S. Appl. No. 17/175,485 titled "Apparatuses and Methods for Distributed Targeted Refresh Operations", filed Feb. 12, 2021.
U.S. Appl. No. 17/347,957 titled "Apparatuses and Methods for Controlling Steal Rates", filed Jun. 15, 2021.
U.S. Appl. No. 16/208,217, titled "Semiconductor Device Performing Row Hammer Refresh Operation", filed Dec. 3, 2018.
U.S. Appl. No. 16/230,300, titled "Apparatuses and Methods for Staggered Timing of Targeted Refresh Operations", filed Dec. 21, 2018.
U.S. Appl. No. 16/290,730, titled "Semiconductor Device Performing Row Hammer Refresh Operation", filed Mar. 1, 2019.
U.S. Appl. No. 16/374,623, titled "Semiconductor Device Performing Row Hammer Refresh Operation", filed Apr. 3, 2019.
U.S. Appl. No. 17/030,018, titled "Apparatuses and Methods for Controlling Refresh Operations", filed Sep. 23, 2020, pp. all.
U.S. Appl. No. 17/662,733, titled "Apparatuses, Systems, and Methods for Identifying Victim Rows in a Memorydevice Which Cannot Be Simultaneously Refreshed" filed May 10, 2022.
U.S. Appl. No. 17/731,529, titled "Apparatuses and Methods for Access Based Refresh Operations", filed Apr. 28, 2022; pp. all pages of the application as filed.
U.S. Appl. No. 17/731,645, titled "Apparatuses and Methods for Access Based Targeted Refresh Operations", filed Apr. 28, 2022; pp. all pages of application as filed.
U.S. Appl. No. 18/064,773, filed Dec. 12, 2022 titled, "Apparatuses and Methods for Access Based Refresh Timing".

* cited by examiner

APPARATUSES AND METHODS FOR STAGGERED TIMING OF SKIPPED REFRESH OPERATIONS

CROSS-REFERENCE TO RELATED APPLICATION

This application is a continuation of U.S. patent application Ser. No. 16/432,604, filed Jun. 5, 2019, issued as U.S. Pat. No. 10,978,132 on Apr. 13, 2021. This application and patent are incorporated by reference herein in their entirety and for all purposes.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto-refresh operation. The targeted refresh operations may occur with timing interspersed between the auto-refresh operations.

DETAILED DESCRIPTION

Figure 1:
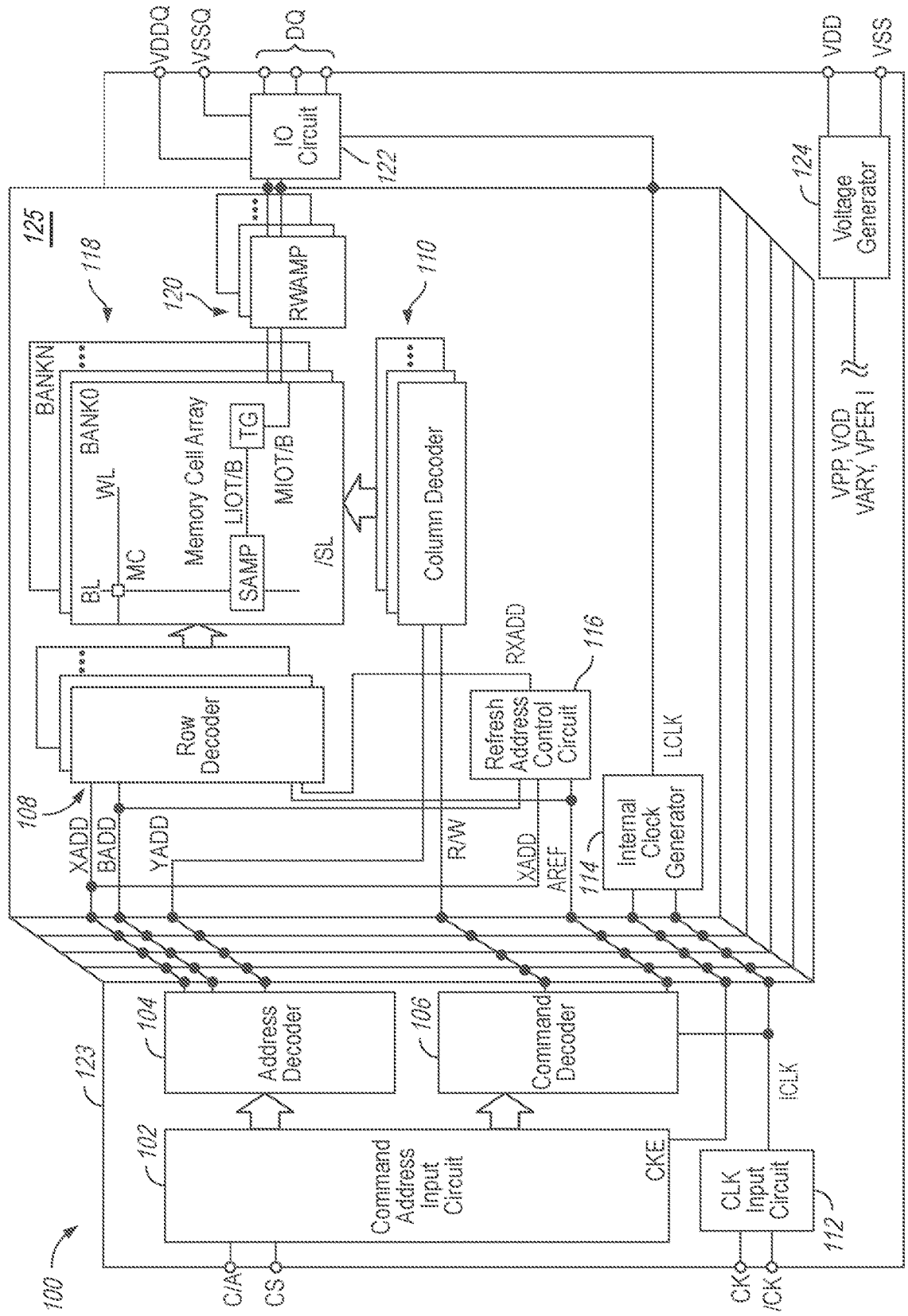
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information, and may be organized at the intersection of word lines (rows) and bit lines (columns). The word lines and bit lines may be organized into a memory bank, and the memory device may include a single memory die or a plurality of memory die. Each memory die may include a plurality of memory banks. One or more memory dies may be organized into a memory package, in some examples. In some embodiments, the memory dies of the memory package may be stacked on each other. In some embodiments, a plurality of memory packages or a plurality of single-die memory devices may be organized into a memory module. The memory device may receive one or more command signals which may indicate operations in one or more of the dies of one or more memory packages. The memory dies may be coupled to the command signals in common, may receive commands from a master die and/or interface chip, and/or may individually receive commands. For example, the memory dies of the package may receive a refresh signal, which may control the timing of refresh operations in the memory dies.

Information in the memory cells may decay over time, in some examples. The memory cells may be refreshed on a row-by-row basis. During a refresh operation, the information in one or more rows may be read out and then written back to the respective rows. A refresh command (e.g., an auto-refresh command AREF) may control a timing of the refresh operations. In some embodiments, the memory device may generate one or more "pumps", which may be activations of an internal refresh signal responsive to receiving an activation of the refresh command. The memory dies may be capable of performing more than one type of refresh operation responsive to the refresh command and/or refresh pumps. For example, the memory dies may be capable of skipping all refresh operations (e.g., performing no refresh operations), performing an auto-refresh operation, or performing a targeted refresh operation. The memory dies may have internal logic configured to determine which type of refresh operation to perform and/or may receive signals (e.g., from an interface and/or controller) that indicates which type of refresh operation should be performed. In some examples, the memory dies may be capable of performing a combination of different operations during one refresh command.

During an auto-refresh operation (e.g., initiated by an activation of the auto-refresh command AREF and/or an activation of a pump), a memory die may refresh a group of rows of the memory array. From one auto-refresh operation to the next, the group of rows to be refreshed may be selected according to a predetermined sequence or pattern.

The auto-refresh operation may cycle through and refresh all rows of the memory array of a memory die within a specified time period to prevent data loss (e.g., each row may be refreshed within a specified maximum refresh time period). The specified maximum refresh time period may be based on a normal rate of data degradation in the memory cells.

During a targeted refresh operation, a particular row or rows of memory cells of a memory array may be refreshed in response to detection of an attack on the particular row. Repeated access to a particular row of memory (e.g., an aggressor row) may cause an increased rate of decay in neighboring rows (e.g., victim rows) due, for example, to electromagnetic coupling between the rows. Information in the victim rows may decay at a rate such that data may be lost if they aren't refreshed until the next auto-refresh operation of that row. In order to prevent information from being lost, it may be necessary to identify aggressor rows and then carry out a targeted refresh operation on one or more associated victim rows. In some embodiments, the targeted refresh operation may "steal" a timeslot (e.g., an activation of a pump, an activation of the auto-refresh command AREF) that would have otherwise been used for an auto-refresh operation.

In some examples, auto-refresh commands AREF may be provided to a memory die at a higher frequency than is necessary to reliably maintain information stored in memory cells of a memory die. Thus, in some examples, the charge retention characteristics of the memory cells of a memory die may allow refresh operations to be periodically skipped, which may reduce power consumption during those refresh cycles.

It may be important to control an amount of current drawn by the memory device during refresh operations. Typically, an auto-refresh operation may draw more current than a targeted refresh operation, since more rows may be refreshed during a given auto-refresh operation than are refreshed during a given targeted refresh operation. Thus, if all memory banks of a memory die or all memory die of a group of memory die of a memory package or module contemporaneously perform an auto-refresh operation, current drawn may exceed a defined current limit, in some examples. As previously described, one way to reduce current draw is to periodically skip refreshes when possible. However, if all memory banks of a memory die or all memory die of a group of memory die of a memory package or module contemporaneously skip refresh operation and contemporaneously perform auto-refresh operation, the excessive current draw issue may persist.

The present disclosure is drawn to apparatuses, systems, and methods for staggering timing of different types of refresh operations. Since skipped and targeted refresh operations draw less current than auto-refresh operations, it may be desirable to reduce the number of memory dies (or memory banks of a single memory die) that are contemporaneously performing an auto-refresh operation by having a first subset of the memory dies (or first subset of memory banks) perform the auto-refresh operation while a second subset of the memory dies (or second subset of memory banks) skip a refresh operation, perform a targeted refresh operation, or a combinations thereof. For example, at a moment in time when a maximum number of memory dies (or memory banks) are performing a refresh operation, some of the memory dies (or memory banks) may skip a refresh operation and/or some of the memory dies (or memory banks) may perform a targeted refresh operation rather than performing an auto-refresh operation. In an example implementation, each of the memory dies may skip a refresh operation at a different activation of a refresh timing command (e.g., an auto-refresh command AREF and/or a pump). Thus, a first memory die may skip a refresh operation and a second die may perform an auto-refresh operation responsive to a first activation of a refresh timing signal, and the first memory die may perform an auto-refresh operation and the second die may skip a refresh operation responsive to a second activation of the refresh timing signal.

FIG. 1 is a block diagram of a semiconductor device according to at least one embodiment of the disclosure. The semiconductor device 100 may be a semiconductor memory device, such as a DRAM device integrated on a single semiconductor chip. The example device 100 of FIG. 1 may include a memory package such as the stack 125 of memory dies positioned on a substrate 123, which may function as (and may be referred to) as an interface. Although certain components are shown in the dies of the stack 125, and certain components on the substrate 123, other arrangement of the components of the device 100 between the stack 125 and the substrate 123 are possible in other example embodiments. In some embodiments, the stack 125 of the device 100 may include multiple die. In other embodiments, the stack 125 may include a single die.

For brevity and clarity of illustration, only the components of one memory die in the stack 125 are shown in FIG. 1. Generally, the different memory dies of the stack 125 may each have similar components to each other. In some embodiments, each memory die of the stack 125 may be physically identical to each other. The substrate 123 may act as an interface, and may send and receive information (e.g., data, commands) to and from the outside, while the memory dies in the stack 125 communicate with components of the substrate. As described herein, commands and other signals sent by the substrate 123 may be sent to all memory dies in the stack 125 or may be separately addressed to individual memory dies of the stack 125.

The semiconductor device 100 includes a memory array 118. The memory array 118 may be positioned in a memory die of the stack 125. The memory array 118 is shown as including a plurality of memory banks BANK0-N, with a total count of memory banks being 2, 4, 8, 16, etc., including any number between those and any number greater than 16. Each of the memory banks BANK0-N may include a plurality of word lines WL, a plurality of bit lines BL and /BL, and a plurality of memory cells MC arranged at intersections of the plurality of word lines WL and the plurality of bit lines BL and BL. The selection of the word line WL is performed by a row decoder 108 and the selection of the bit lines BL and /BL is performed by a column decoder 110. The row and column decoders 108 and 110 may also be positioned in the memory dies of the stack 125. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A)

terminals coupled to a command and address bus to receive commands and addresses, and a chip select (CS) terminal configured to receive a CS signal, clock terminals to receive clocks CK and /CK, data terminals DQ to provide data, and power supply terminals to receive power supply potentials VDD, VSS, VDDQ, and VSSQ. The external terminals may be positioned on the substrate 123.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. In some embodiments, the address decoder 104 may also indicate a particular memory die of the stack 125 for activation. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The semiconductor device 100 may receive an access command which is a read command. When a read command is received, and a bank address, a row address and a column address (and optional die address) are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The semiconductor device 100 may receive an access command (e.g., a write command). When the write command is received, and a bank address, a row address and a column address (and optional memory die address) are timely supplied with the write command, write data supplied to the data terminals DQ is written to a memory cells in the memory array 118 corresponding to the row address and column address. The write command is received by the command decoder 106, and in response, the command decoder 106 may provide internal commands to cause the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The semiconductor device 100 may also receive commands causing it to carry out refresh operations. The refresh signal AREF may be a pulse signal that is activated when the command decoder 106 receives a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing period. Thus, refresh operations may automatically continue according to a predefined period. A self-refresh exit command may cause the automatic activation of the refresh signal AREF to stop and return to an IDLE state.

The refresh signal AREF is supplied to the refresh address control circuit 116. In some examples, each memory die of the stack 125 may include an individual refresh address control circuit 116 for each memory bank of the memory banks BANK0-N. In other examples, each memory die may include a single refresh address control circuit 116. In anticipation of a refresh operation, the refresh address control circuit 116 supplies a refresh row address RXADD to the row decoder 108, which may refresh a wordline WL indicated by the refresh row address RXADD. The refresh address control circuit 116 may control a timing of the refresh operation, and may select and provide the refresh address RXADD. The refresh address control circuit 116 may be controlled to change details of the refreshing address RXADD (e.g., how the refresh address is calculated, the timing of the refresh addresses), or may operate based on internal logic.

During a refresh cycle, a memory die may skip a refresh operation, perform an auto-refresh operation, perform a targeted refresh operation, or some combination thereof. Thus, during a skipped refresh operation, the refresh address control circuit 116 may provide no refresh address RXADD. During an auto-refresh operation or a targeted refresh operation, the refresh address control circuit 116 may provide as the refreshing address RXADD either one or more automatic refresh addresses (e.g., an auto-refresh address) or a targeted refresh address (e.g., a victim address), respectively. The automatic refresh addresses may be part of a sequence of addresses that are provided based on activations of the auto-refresh signal AREF. The refresh address control circuit 116 may cycle through the sequence of auto-refresh addresses at a rate determined by an activation rate of the auto-refresh signal AREF. Multiple addresses may be provided as the refreshing address RXADD as part of an auto-refresh operation. In some embodiments, a group or block of addresses may all be indicated by the refresh address RXADD, and the row decoder 108 may refresh the entire group or block of addresses.

The refresh address control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh address control circuit 116 may selectively use one or more signals of the device 100 to calculate the targeted refresh address RXADD. For example, the refresh address RXADD may be a calculated based on the row addresses XADD provided by the address decoder. In some embodiments, the refresh address control circuit 116 may sample the current value of the row address XADD provided by the address decoder 104 and determine a targeted refresh address based on one or more of the sampled addresses.

The targeted refresh address may be based on characteristics over time of the row addresses XADD received from the address decoder 104. The refresh address control circuit 116 may sample the current row address XADD to determine its characteristics over time. The sampling may occur intermittently, with each sample acquired based on a random or semi-random timing. The refresh address control circuit 116 may use different methods to calculate a targeted refresh address based on the sampled row address XADD. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

The refresh address RXADD may be provided with a timing based on a timing of the refresh signal AREF. The refresh address control circuit 116 may have time slots corresponding to the timing of the refresh signal AREF, and may provide none, one, or more refresh addresses RXADD during each time slot. In some embodiments, a refresh may be skipped or the targeted refresh address may be issued during (e.g., "steal") a time slot that would otherwise have been assigned to an auto-refresh address. In some embodiments, multiple refresh operations may be performed in response to an activation of the refresh signal AREF. In this example, certain time slots may be reserved for a particular type of refresh operation according to some predefined pattern. Based on the predefined pattern, the refresh address control circuit 116 may determine whether to provide a targeted refresh address, to provide no refresh address (e.g., a skipped refresh), or provide an auto-refresh address during a particular time slot. In some examples, the refresh address control circuit 116 may be configured to override a pattern, such as in response to a detected row hammer attack.

In some embodiments, the refresh address control circuit 116 may include logic, such as a state machine and/or counter that are used to determine whether to initiate a skipped refresh operation, an auto-refresh operation, or a targeted refresh operation. For example, the refresh address control circuit 116 may count a number of activations of the refresh signal AREF with a counter, and when the counter reaches a maximum value and 'rolls over' back to a minimum value, a refresh operation may be skipped. The logic may also be coupled to settings, such as fuse settings, which may be used to alter the operation of the logic in a given memory die. In other embodiments, a refresh operation sequence may occur over many refresh operation cycles.

Since more addresses may be provided as the refresh address RXADD during an auto-refresh operation than during a targeted refresh operation or a skipped refresh operation, an auto-refresh operation may draw more current (e.g., more power) than a targeted refresh operation or a skipped refresh operation. To reduce a peak current drawn by the semiconductor device 100 at any given point in time during a refresh operation, skipped refresh and/or target refresh operations may be staggered in time with auto-refresh operations between different memory dies of the stack 125 (and/or between different memory banks BANK0-N of the memory array 118 of a particular memory die). The different memory dies of the stack 125 may have settings that cause the skipped refresh operations and the auto-refresh operations to occur at different times in the different memory dies (or the different memory banks BANK0-N of a memory die). In one example implementation, the refresh address control circuits 116 of different memory dies in the stack 125 may indicate a skipped refresh operation with a frequency based on the refresh signal (e.g., a skipped refresh operation may be performed responsive to every n activation of the refresh signal AREF). In another example implementation, the refresh address control circuits 116 of a particular die of the stack 125 may indicate a skipped refresh operation for a corresponding memory bank of the memory banks BANK0-N with a frequency based on the refresh signal (e.g., a skipped refresh operation may be performed responsive to every $n^{th}$ activation of the refresh signal AREF). Each of the memory dies (e.g., or memory banks BANK0-N of a memory die) may perform skipped refresh operations with the same frequency, however settings (e.g., fuse settings) in each of the memory dies (or memory banks BANK0-N) may offset the phase of the skipped refresh operations.

As previously described, the timings of the skipped refresh operations may be staggered in time to reduce a peak power drawn by the memory device 100 during a refresh operation. The settings of the different memory dies of the stack 125 (or different memory banks BANK0-N of a memory die) may be set such that when a maximum number of simultaneous refresh operations would occur across one or more of the memory dies (or one or more of the memory banks BANK0-N), at least one of the memory dies (or at least one of the memory banks BANK0-N) is performing a skipped refresh operation rather than an auto-refresh operation.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
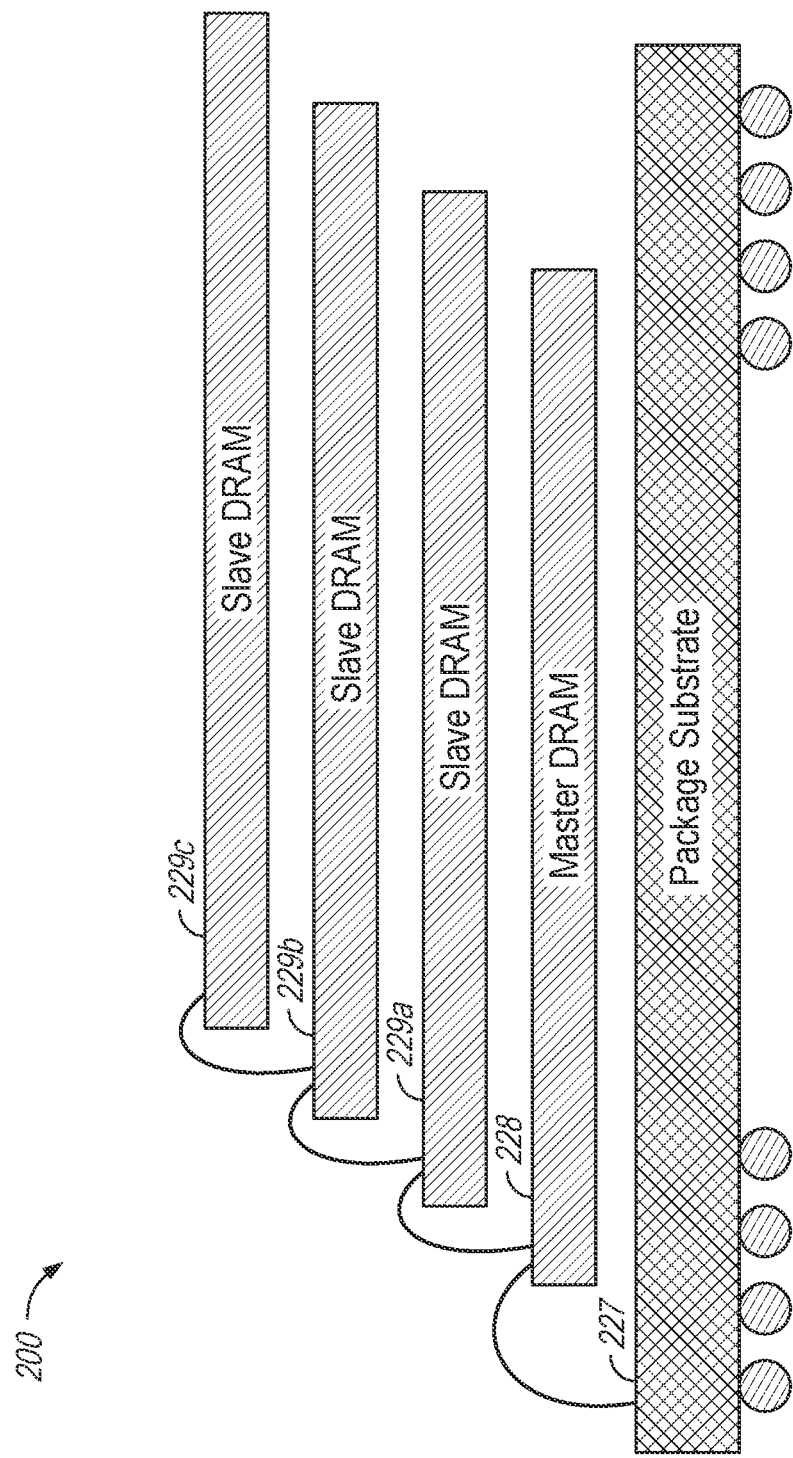
FIG. 2 is a block diagram of a master/slave configuration of a memory package according to an embodiment of the present disclosure.

FIG. 2 is a block diagram of a master/slave configuration of a memory package 200 according to an embodiment of the present disclosure. The memory package 200 may be an implementation of the semiconductor device 100 and memory stack 125 of FIG. 1 in some embodiments. The memory package 200 is an example representing one possible organization of memory dies (and a substrate/interface) into a memory package for use in a memory device. The memory package 200 includes a package substrate 227 having terminals configured to send and receive information to other components outside the memory package 200. The memory package 200 may also include a master memory die (master die or master DRAM) 228, and a plurality of slave memory dies (slave dies or slave DRAMs) 229a-c. The master die 228 sends and receives signals to and from the substrate 227 and in turn provides signals to and receives signals from the slave dies 229a-c. Although only a single stack of dies 228 and 229a-c is shown, in some embodiments the package substrate 227 may include multiple stacks of dies.

Embodiments which are generally similar to the structure of the memory package 200 may be referred to as 3DS packages, and each of the dies may generally be referred to as a logical rank. The memory package 200 of FIG. 2, illustrates an example embodiment with 4 different memory dies connected with wire bonds (e.g., master die 228 and 3 slave dies 229a-c). In other example embodiments more or fewer memory dies may be used. For example, some memory stacks may include 8 or more memory dies. In some examples, multiple memory dies in a stack may be bonded using through-silicon vias (TSVs) or other technologies.

Each of the master 228 and slave memory dies 229a-c may include one or more memory arrays (e.g., memory array 118 of FIG. 1). The memory dies 228 and 229a-c may also each include other components of the memory device, such as refresh address control circuits (e.g., refresh address control circuit 116 of FIG. 1), and row and column decoders (e.g., 108 and 110 of FIG. 1). Other components of the memory device (e.g., the components of memory device 100 of FIG. 1 shown on the substrate 123) may be distributed between the substrate 227 and the memory dies 228 and 229a-c. In some embodiments, the master die 228 and each of the slave dies 229a-c may be physically identical to each other.

The master die 228 may be coupled to the substrate 227 and to the first slave die 229a. The first slave die 229a is coupled to the master die 228 and also to the next slave die 229b, and so forth. The dies 228 and 229a-c may be coupled to each other (and the substrate 227) with a variety of methods. In some embodiments, the dies may be coupled together with wire bonds. In some embodiments, the dies may be coupled together using through silicon vias (TSVs). In a 3DS package, there may be an additional power constraint based on the peak power (and/or current) which may be pulled through the couplings between the dies (e.g., the wire bonds and/or TSVs).

The substrate 227 may receive a refresh command configured to cause the memory package 200 to be put in a refresh state. In some embodiments, the command may specify which of the memory dies 228 and 229a-c that should be put in the refresh state. While in a refresh state, each of the memory dies 228 and 229a-c may perform refresh operations (e.g., skipped refresh operations, auto-refresh operations, and/or targeted refresh operations). In some embodiments, responsive to a refresh command, the memory package 200 may place only a subset or group of the memory dies 228 and 229a-c (e.g., defined by a logical rank) into a refresh state at the same time. In some examples, after a logical rank begins performing a refresh operation, a minimum amount of time may elapse before a next logical rank can begin performing a refresh operation. Thus, there may be an offset of at least that minimum timing between a first refresh operation of a first logical rank and a first refresh operation of a second logical rank.

While the memory package 200 is in a refresh mode, the substrate 227 may receive a refresh command and provide it to the master die 228. The master die 228 may decode the refresh command and provide the refresh signal AREF to the slave dies 229a-c (as well as to internal components of the master die 228). The refresh signal may be periodically activated (e.g., raised to a high logical level). Each of the logical ranks may receive the refresh signal (e.g., AREF) from the substrate, which may be used to control the timing of the refresh operations in the logical ranks. In some embodiments, the logical ranks (e.g., groups of the memory dies 228 and 229a-c) may perform one or more refresh operations responsive to each activation of the refresh signal. In some embodiments, the logical ranks may begin providing activations of a refresh pump signal responsive to receiving the refresh signal, and may perform refresh operations responsive to the activations of the refresh pump signal.

In some embodiments, each of the logical ranks may have at least one refresh address control circuit (e.g., 116 of FIG. 1) configured to determine whether an auto-refresh operation, a targeted refresh operation, or a skipped refresh operation is going to occur on a respective memory die 228 and 229a-c or a respective memory bank of the memory die 228 and 229a-c. Each of the logical ranks may include settings that is used to determine the timing of skipped refresh, auto-refresh, and targeted refresh operations. For example, fuses in each of the memory dies 228 and 229a-c may be used to control the timing and/or pattern of the different types of refresh operations in each of the memory dies 228 and 229a-c (or in each of the memory banks of each of the memory dies 228 and 229a-c). For example, each of the memory dies 228 and 229a-c (or each the memory banks of each of the memory dies 228 and 229a-c) may have a counter such that after a certain number of activations of the refresh signal (and/or refresh pump signal), the memory dies 228 and 229a-c (or the memory banks of each of the memory dies 228 and 229a-c) may perform a skipped-refresh operation or a targeted refresh operation instead of an auto-refresh operation. In some embodiments, the memory dies 228 and 229a-c (or the memory banks of each of the memory dies 228 and 229a-c) may perform the skipped refresh operations at the same skipped refresh frequency (e.g., after counting the same number of activations of the refresh signal) and may perform the targeted refresh operations at the same target refresh frequency (e.g., after counting the same number of activations of the refresh signal).

However, each of the memory dies 228 and 229a-c (or each the memory banks of each of the memory dies 228 and 229a-c) may be configured to offset the skipped refresh operations or the target refresh operations in time using programmed configurations or settings (e.g., such as altering an initial value of the count). Other embodiments may use other methods to stagger the skipped refresh operations in time and/or stagger the targeted refresh operations in time. The stagger may be relative to other memory dies of the logical rank, or the stagger may be relative to other memory banks within a single memory die.

In some embodiments, the master die 228 may determine a timing of skipped refresh, auto-refresh, and targeted refresh operations in the master die 228 and in each of the slave dies 229a-c. For example, the master die 228 may provide a separate skipped refresh signal and a separate targeted refresh signal (e.g., row hammer refresh (RHR)) for each of the slave dies 229a-c. The master die 228 may include internal logic, and may time when it provides each of the separate targeted refresh signals to their respective die. As an example operation, when the master die 228 receives a first activation of the refresh signal, it may send the skipped refresh signal to slave die 229a. When the master die 228 receives a second activation of the refresh signal, it may send the skipped refresh signal to slave die 229b. When the master die 228 receives a third activation of the refresh signal, it may send the skipped refresh signal to the slave die 229c. Upon a subsequent activation of the refresh signal, the master die 228 may repeat the cycle again. Other methods of operation and/or skipped refresh patterns may be used in other example embodiments. In other embodiments, each memory die 228 and 229a-c may include control logic to select groups of memory banks within a memory die (e.g., the master die 228 and the slave dies 229A-C) on which to perform a skipped refresh operation during each cycle.

In some embodiments, the refresh timing settings that control the timing of the skipped refresh, the auto-refresh, and targeted refresh operations may be determined when the memory package 200 is assembled. In some embodiments, the timing settings may be determined based on the placement of the memory dies 228 and 229a-c relative to each other (e.g., the slave dies 229a may take on certain timing settings based on the count of memory dies it is away from the master die 228, etc.). In some other example architectures, memory dies 228 and 229A-C of the memory package 200 may each receive all commands directly from the package substrate 227, rather than via the master die 228. Operation of such a memory package may be similar to the described operation of the memory package 200, with individual memory dies being configured (e.g., programmed) to stagger skipped refresh operations relative to other memory dies or relative to other banks within a memory die. Staggering skipped refresh operations and auto-refresh operations across multiple memory dies or across memory banks within a memory die may reduce peak current draw as compared with performing an auto-refresh operation contemporaneously across all memory dies or across all memory banks within a memory die.

Figure 3:
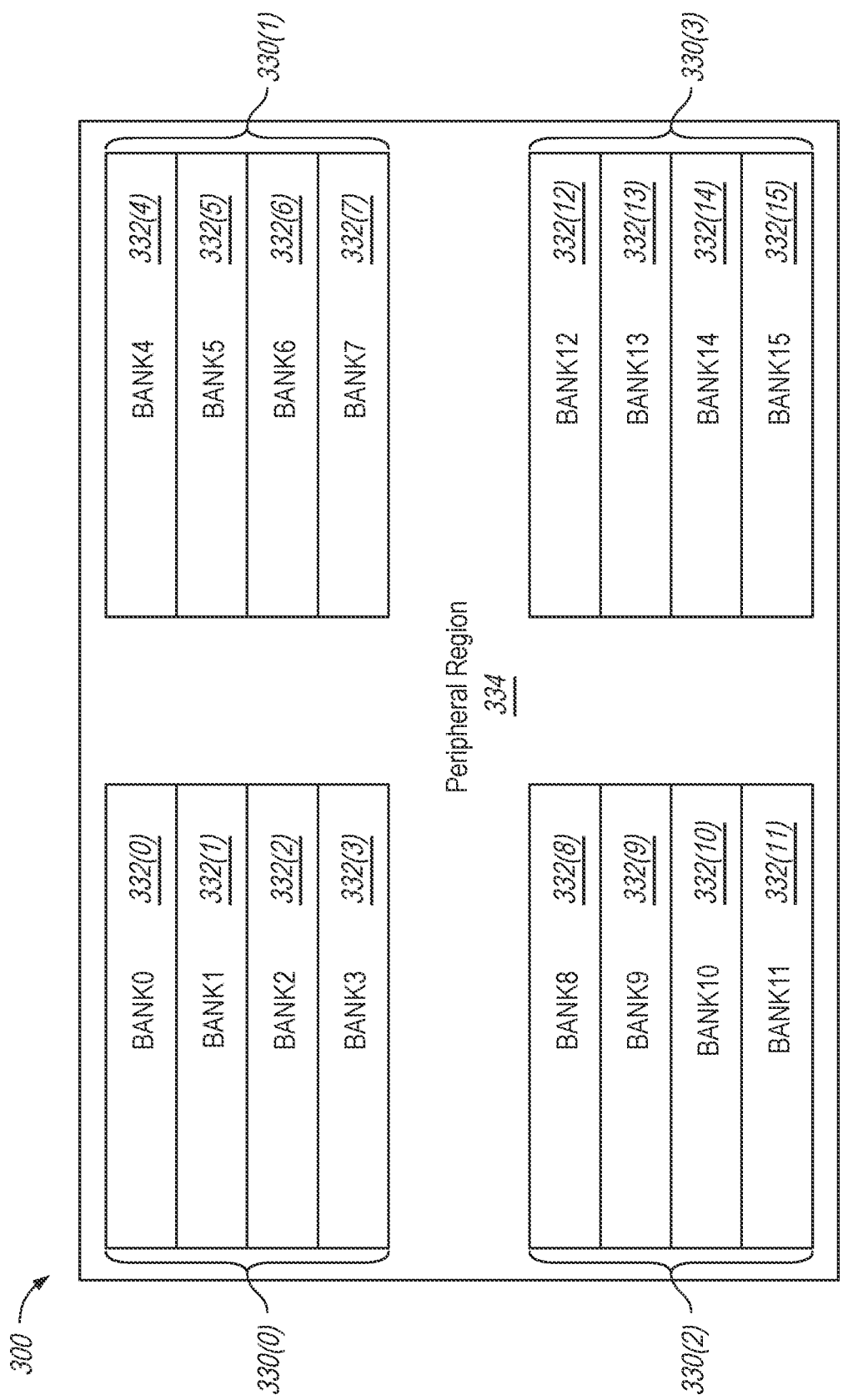
FIG. 3 is a block diagram of a memory array according to an embodiment of the present disclosure.

FIG. 3 is a block diagram of a memory array 300 according to an embodiment of the present disclosure. The memory array 300 may implement the memory array 112 of FIG. 1, in some embodiments. The memory array 300 includes a number of memory banks 332(0)-(15) arranged into memory bank groups 330(0)-(3). The memory bank groups 330(0)-(3) may be physically separated from each other by a peripheral region of the memory device 334.

While the example memory array 300 of FIG. 3 includes four memory bank groups 330(0)-(3), each including respective memory banks of the memory banks 332(0)-(15)(e.g., for a total of sixteen total memory banks 332(0)-(15)), it is understood that other embodiments may have more or fewer of the memory banks 332(0)-(15), and the memory banks may be organized into more or fewer of the memory bank groups 330(0)-(3), with a more or fewer memory banks per memory group. The memory banks 332(0)-(15) and/or the memory bank groups 330(0)-(3) may or may not be physically located next to each other.

Each of the memory banks 332(0)-(15) includes a number of wordlines and bitlines, with a number of memory cells arranged at the intersections. In some embodiments, there may be further organization of the rows (wordlines) and columns (bitlines) within the memory banks 332(0)-(15). For example, each of the memory banks 332(0)-(15) may include a number of memory mats each containing a number of rows and columns. The memory mats may be organized into memory mat sets. In some embodiments, during an auto-refresh operation, an address may be provided which causes a wordline in a particular memory mat of each of the sets in each of the memory banks 332(0)-(15) to refresh.

In some embodiments, refresh commands may be issued in common to all of the memory banks 332(0)-(15) and all of the memory banks 332(0)-(15) may simultaneously perform refresh operations. In some embodiments, a refresh command may be issued which specifies a subset of the memory banks 332(0)-(15). For example, a particular memory bank group (or groups) 330(0)-(3) of the memory banks 332(0)-(15) may begin refreshing. In another example, a portion of the memory banks 332(0)-(15) in each of the memory bank groups 330(0)-(3) (or a subset of the groups) may begin refreshing (e.g., the first memory bank 332(00), 332(10), 332(20), 332(30) in each of the memory bank groups 330(0)-(3)). Once refresh commands have been issued to one or more of the memory banks 332(0)-(15), each of the indicated memory banks of the memory banks 332(0)-(15) may simultaneously perform one or more refresh operations. The timing of skipped and auto-refresh operations may be staggered in the indicated memory banks of the memory banks 332(0)-(15), such that a portion of the indicated memory banks of the memory banks 332(0)-(15) perform a skipped refresh operation simultaneous with a portion of the indicated banks of the memory banks 332(0)-(15) performing an auto-refresh operation.

The indicated memory banks of the memory banks 332(0)-(15) that are refreshing may have logic and/or programming that configures a first subset of the indicated memory banks to perform auto-refresh operations while a second subset of the memory banks skips refresh operations. In some embodiments, the logic/programming may be inherent to the design of the memory array 300, rather than being based on settings programmed after the memory device is assembled.

Each of the memory banks 332(0)-(15) may be associated with a refresh control circuit (e.g., 116 of FIG. 1) configured to issue refresh addresses to the respective memory bank 332(0)-(15). Each refresh control circuit may receive activations of a refresh signal AREF and may use an internal logic to determine whether the provided refresh address should indicate an auto-refresh operation, a targeted refresh operation, or a skipped refresh operation. For example, each refresh control circuit may count a number of auto-refresh operations, and perform a targeted refresh operation or a skipped refresh operation after a certain number of auto-refresh operations have been performed. The counters in the different refresh control circuits may be initialized to different values to stagger the skipped refresh operations across the different memory banks.

Figure 4:
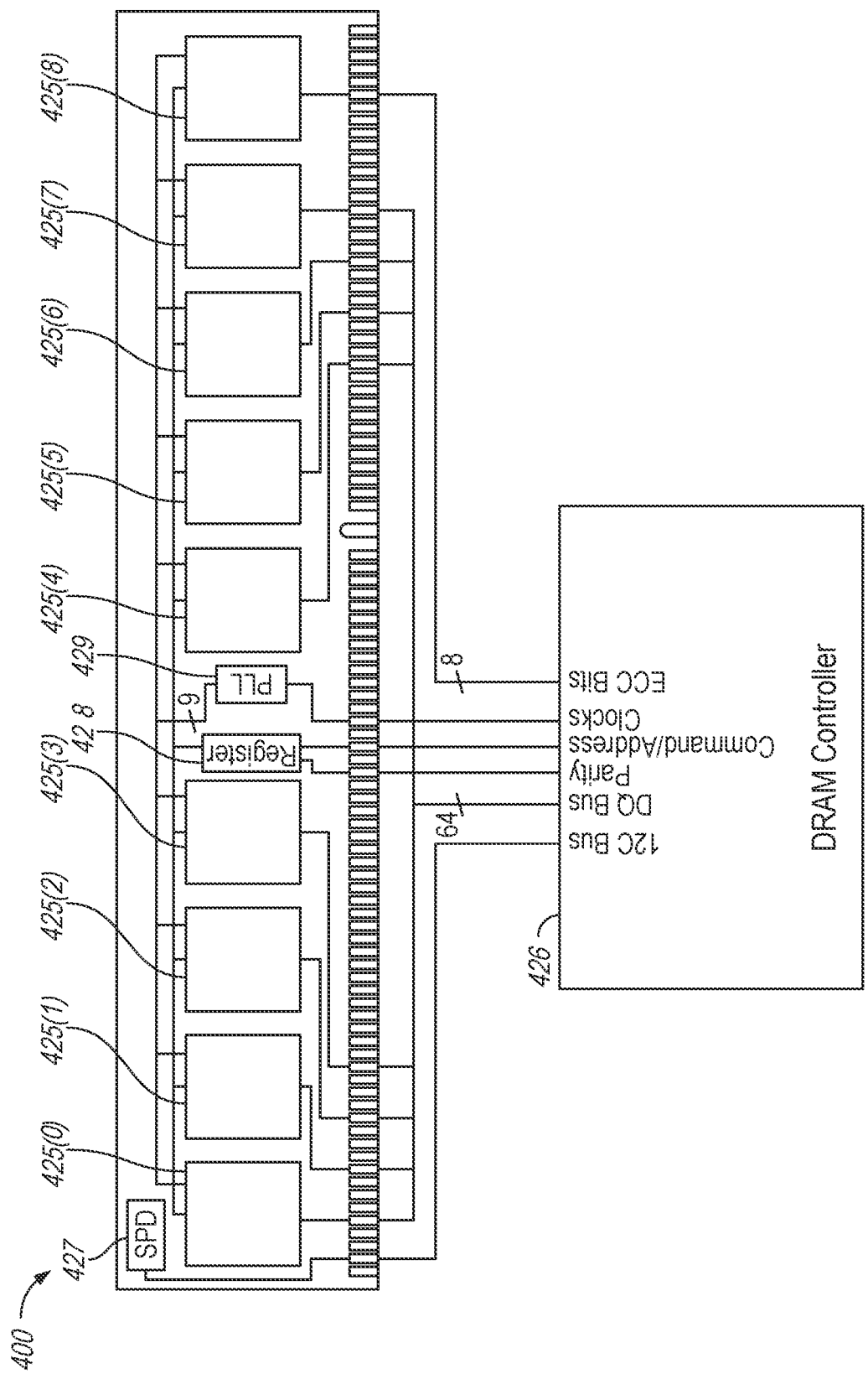
FIG. 4 is a block diagram of a memory module according to an embodiment of the present disclosure.

FIG. 4 is a block diagram of a memory module 400 according to an embodiment of the present disclosure. One or more memory packages (e.g., or memory dies) 425(0)-(8) may be organized together into a memory module 400. The memory packages 425(0)-(8) may be included on one or both sides of the memory module 400. Each of the memory packages 425(0)-(8) may be any arrangement of memory package, such as one or more of the memory devices 100 of FIG. 1, the memory package 200 of FIG. 2, and/or the memory array 300 of FIG. 3. In some embodiments the memory packages 425(0)-(8) may all be the same type of memory package. In other embodiments, the memory packages 425(0)-(8) may include a mix of different types of memory packages may be used. A controller 426 may provide various command signals to the memory packages 425(0)-(8). In some examples, the memory module 400 may be configured as a dual in-line memory module (DIMM). In other examples, the memory module 400 may be configured as a non-volatile DIMM (NVDIMM) that includes a combination of volatile memory devices (e.g., DRAM) and non-volatile memory devices (e.g., flash memory) (not shown).

Although the memory module 400 shown in FIG. 4 having 9 memory packages 425(0)-(8), more or fewer packages 425(0)-(8) may be used in other embodiments. For example, in some embodiments, the memory packages 425(0)-(8) may be organized into different physical ranks. For example, there may be first physical rank on a first side of the module 400 (e.g., the 9 memory packages 425(0)-(8) as shown in FIG. 4) and a second physical rank on a back side of the module 400 (e.g., 9 more memory packages on a reverse side of the module 400). In some embodiments, there may be 18 packages 425(0)-(8) per physical rank, and one or more physical ranks in the memory module 400. The memory module 400 may include a serial presence detect (SPD) chip 427 configured to provide information about the memory module 400, such as number of memory packages 425(0)-(8), ranks, types of memory, etc. The memory module 400 may further include a register 428 configured to store configuration information for the memory module 400, and a phase-locked loop (PLL) circuit 429 configured to control clock timing for the memory module 400.

Similar to spacing out the auto-refresh, targeted refresh, and skipped refresh operations within a memory package 425(0)-(8) as described herein, it may also be desirable to manage refresh timing between memory packages 425(0)-(8) of the module 400. For the sake of brevity, similar components, structures, and/or operations to those previously described are not repeated. For example, one or more of the memory packages 425(0)-(8) may be entered into a refresh mode in which one or more of the respective memory dies performs one of an auto-refresh operation, a targeted refresh operation, or a skipped refresh operation. As well as being staggered between the memory dies of a given the memory package 425(0)-(8) or the memory banks of a die of a given memory package, the targeted refresh operations and the skipped refresh operations may also be staggered between different packages 425(0)-(8) of the memory module 400 to reduce peak current draw.

Figure 5:
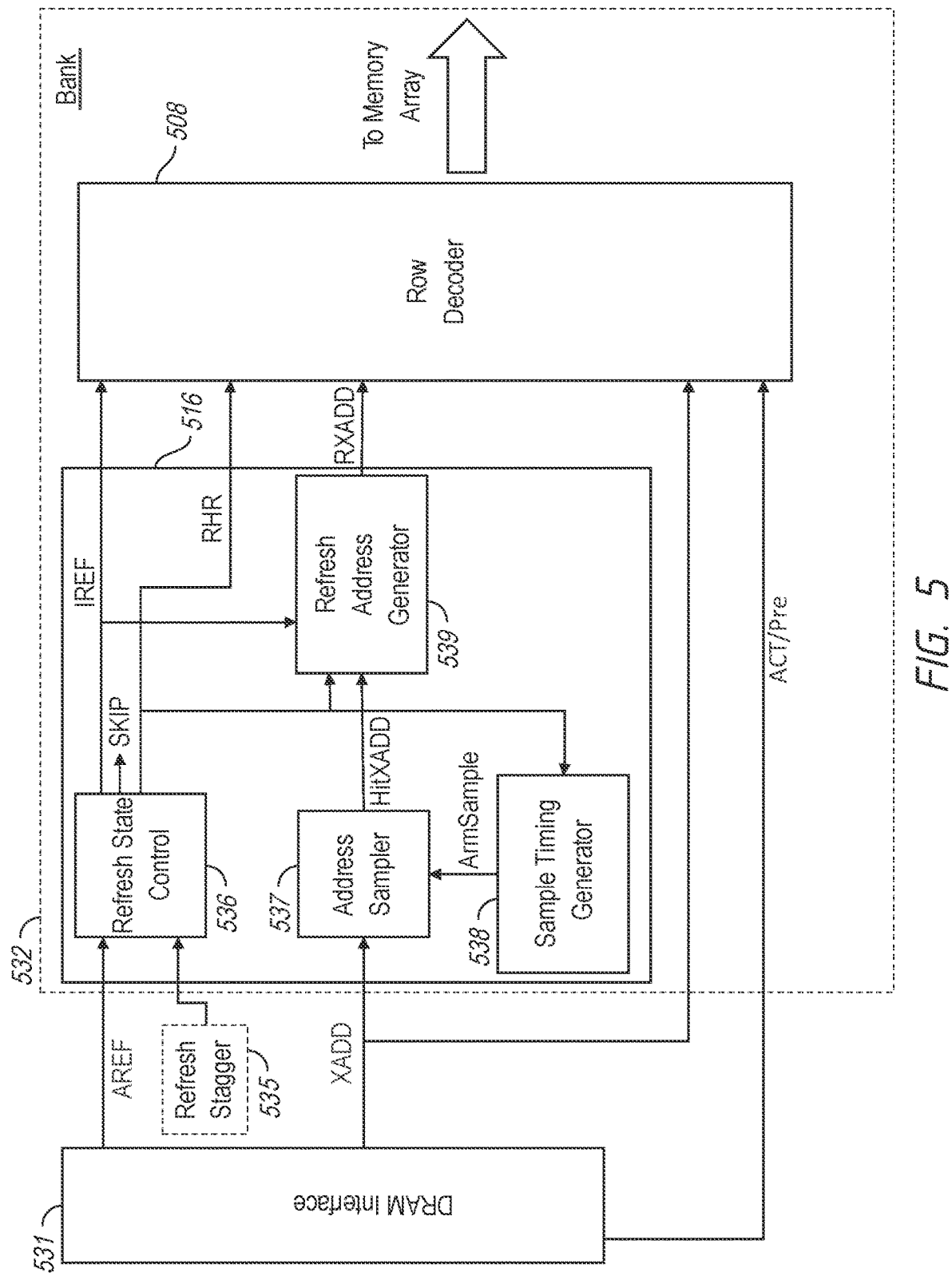
FIG. 5 is a block diagram of a refresh control circuit according to an embodiment of the present disclosure.

FIG. 5 is a block diagram of a refresh address control circuit 516 according to an embodiment of the present disclosure. Certain internal components and signals of the refresh address control circuit 516 are shown to illustrate the operation of the refresh address control circuit 516. The dotted line 532 is shown to represent that in certain embodiments, each of the components (e.g., the refresh address control circuit 516 and row decoder 508) may correspond to a particular bank of a memory array, and that these components may be repeated for each of the memory banks of the memory array. In some embodiments, the components shown within the dotted line 532 may be positioned in each of the memory banks. Thus, there may be multiple refresh address control circuits 516 and row decoders 508. For the sake of brevity, only components for a single memory bank will be described. In some embodiments, the refresh address control circuit 516 may implement the refresh address control circuit 116 of FIG. 1, and may be positioned in each memory die of a memory package.

An interface 531 (e.g., an external memory controller interface or a command decoder interface) may provide one or more signals to an address refresh control circuit 516 and row decoder 508. The refresh address control circuit 516 may include a sample timing generator 538, an address sampler 537, a row hammer refresh (RHR) state controller 536 and a refresh address generator 539. The interface 531 may provide one or more control signals, such as an auto-refresh signal AREF, and a row address XADD. The refresh state control 536 may determine whether a skipped refresh operation, an auto-refresh operation, or a targeted refresh operation should be performed. The refresh state control 536 may indicate different refresh operations in different memory banks or memory dies in order to stagger the skipped, targeted, and auto-refresh operations between the memory banks or memory dies. A refresh stagger circuit 535 may control the refresh state control 536 to stagger the skipped, targeted, and auto-refresh operations.

The refresh address control circuit 516 shows components associated with a particular implementation of detecting aggressor addresses by sampling incoming values of the row address XADD at random or semi-random timing. Other methods of detecting aggressor addresses may be used in other embodiments, and other components may be provided in the refresh address control circuit 516.

The address sampler 537 may sample (e.g., latch) the current row address XADD responsive to an activation of ArmSample. The address sampler 537 may also provide one or more of the latched addresses to the refresh address generator 539 as the matched address HitXADD. The refresh state control 536 may provide the RHR signal to indicate that a row hammer refresh operation (e.g., a refresh of the victim rows corresponding to an identified aggressor row) should occur. The refresh state control 536 may also provide an internal refresh signal IREF to indicate that an auto-refresh operation should occur and no signal (or a skip signal SKIP) when no refresh operation should occur. The refresh state control 536 may be used to control the timings of skipped refresh operations, targeted refresh operations, and auto-refresh operations. The activations of SKIP, IREF, and RHR signals may represent activations of a pump signal. Note that FIG. 5 depicts the SKIP signal for clarity, and that an actual implementation may not include any such signal. Rather, for a skipped refresh operation, the refresh state control 536 may hold the IREF and RHR signal in an inactive state to indicate a skipped refresh operation.

There may be a refresh state control 536 for each of the different banks. Each refresh state control 536 may include internal logic configured to determine the timing with which it provides signals (e.g., SKIP, IREF, or RHR) to indicate if a skipped, auto, or targeted refresh operation should be performed in the associated memory bank. In some embodiments, each refresh state control 536 may include one or more counters, and may provide the SKIP or the RHR signal based on a number of occurrences of the refresh signal AREF (and/or the number of occurrences of the IREF signal). In examples where the skipped refresh operations or the targeted refresh operations are staggered across memory dies of a memory package or module, each of the different memory banks of a single memory die may initialize to a same value to align the refresh operations on a single memory die, with some memory dies being initialized to different values. Accordingly, each refresh state control 536 may produce the same pattern of skipped, targeted, and auto-refresh operations, however those patterns may be out of phase with each other such that they are staggered in time. In some examples, the refresh state control 536 may be coupled to settings, such as fuse settings (and/or may include settings) that are memory die specific. In some embodiments, the refresh state control 536 may include a counter, and may provide the SKIP signal or the RHR signal based on a number of activations of the refresh signal AREF. In some embodiments, the fuse settings may control an initial value of the counter in the refresh state control 536. In this manner, different patterns of SKIP, RHR, and IREF signals may be generated in different memory dies (and/or different packages of a module) to stagger the timing of targeted refresh operations.

In examples where the skipped refresh operations or the targeted refresh operations are staggered across memory banks of a memory single die, the counter in each refresh state control 536 in each of the different memory banks may initialize to a different value to stagger the refresh operations. Accordingly, each refresh state control 536 may produce the same pattern of targeted and auto-refresh operations, however those patterns may be out of phase with each other such that they are staggered in time. In some embodiments and refresh stagger circuit 535 may provide a signal to the refresh state control circuits 536 to control the staggering. For example, the refresh stagger circuit 535 may provide signals to each of the refresh state control 536 associated with the different memory banks which may indicate when a targeted refresh operation should be performed. In some embodiments, there may be a single refresh stagger circuit 535 that is coupled to all of the refresh address control circuits 516 for the different banks. The refresh stagger circuit 535 may contain internal logic (e.g., counters initialized to different values) that allow it to direct the staggering between the different memory banks.

Responsive to an activation of RHR, the refresh address generator 539 may provide a refresh address RXADD, which may be an auto-refresh address or may be one or more victim addresses corresponding to victim rows of the aggressor row corresponding to the match address HitXADD. The row decoder 508 may perform a refresh operation responsive to the refresh address RXADD and the row hammer refresh RHR signal. The row decoder 508 may perform an auto-refresh operation based on the refresh address RXADD and the internal refresh signal IREF. The row decoder 508 may perform no refresh operations responsive to the SKIP signal (e.g., or responsive to deactivation of both the RHR and IREF signals).

In some embodiments, the refresh address control circuit 516 may determine if no refresh operations (e.g., a skip) are currently needed, or if one or more targeted refresh operations is currently needed. If no refreshes are currently needed, the refresh address control circuit 516 may provide the SKIP signal (e.g., deactivate both of the IREF and the RHR signals). If a targeted refresh operation is currently needed, the refresh address control circuit 516 may provide targeted refresh addresses and activate the RHR signal.

The refresh address control circuits 516 associated with the different banks may each determine a number of targeted refresh operations to perform based on the characteristics of the accesses to the row addresses XADD (e.g., the number, frequency, and/or pattern of accesses). For example, a first refresh address control circuit 516 associated with a first bank containing multiple rows which are hammered may determine that there need to be more targeted refresh operations than a second refresh address control circuit 516 associated with a second bank containing less rows which are hammered. In some embodiments, the refresh operations may occur in cycles (e.g., a certain number of pumps and/or a certain number of AREF occurrences), and the refresh address control circuit 516 may determine a number of skipped refresh operations or a number of targeted refresh operations to perform in each cycle. The remainder of the refresh operations in the cycle may be used for auto-refresh operations. Although different banks may determine different numbers of skipped refresh operations or different numbers of targeted refresh operations to perform, the skipped refresh operations may still be staggered between the different banks and the targeted refresh operations may still be staggered between the different banks, in some examples. In other examples, the skipped and refresh operations may be aligned across all banks of a single die, but may be staggered across different dies.

The interface 531 may represent one or more components configured to provide signals to components of the memory bank (or banks). For example, the interface 531 may represent components such as the command address input circuit 102, the address decoder 105, and/or the command control 106 of FIG. 1. The interface 531 may provide a row address XADD, the auto-refresh signal AREF, an activation signal ACT, and a precharge signal PRE. The auto-refresh signal AREF may be a periodic signal which may indicate when an auto-refresh operation is to occur. The activation signal ACT may be provided to activate a given bank of the memory. The precharge signal PRE may be provided to precharge the given bank of the memory. The row address XADD may be a signal including multiple bits (which may be transmitted in series or in parallel) and may correspond to a specific row of an activated memory bank.

The sample timing generator 538 provides the sampling signal ArmSample. ArmSample may alternate between a low logic level and a high logic level. An activation of ArmSample may be a 'pulse', where ArmSample is raised to a high logic level and then returns to a low logic level. The interval between the pulses of ArmSample may be random, pseudo-random, and/or based on one or more signals of the device (e.g., AREF).

The address sampler 537 may receive the row address XADD from the interface 531 and ArmSample from the sample timing generator 538. The row address XADD may change as the interface 531 directs access operations (e.g., read and write operations) to different rows of the memory cell array (e.g., memory cell array 112 of FIG. 1). Each time the address sampler 537 receives an activation (e.g., a pulse) of ArmSample, the address sampler 537 may sample the current value of XADD. In some embodiments, the address sampler 532 may provide the currently sampled value of XADD as the match address HitXADD. The refresh address generator 539 may provide one or more victim addresses associated with the match address HitXADD as the refresh address RXADD.

In some embodiments, responsive to an activation of ArmSample, the address sampler 537 may determine if one or more rows is an aggressor row based on the sampled row address XADD, and may provide identified aggressor rows as the match address HitXADD. As part of this determination, the address sampler 537 may record (e.g., by latching and/or storing in a register) the current value of XADD responsive to the activation of ArmSample. The current value of XADD may be compared to previously recorded addresses in the address sampler 537 (e.g., the addresses stored in the latch/register), to determine access patterns over time of the sampled addresses. If the address sampler 537 determines that the current row address XADD is being repeatedly accessed (e.g., is an aggressor row), the activation of ArmSample may also cause the address sampler 537 to provide the address of the aggressor row as a match address HitXADD. In some embodiments, the match address (e.g., aggressor address) HitXADD may be stored in a latch circuit for later retrieval by the refresh address generator 539. For example, the value of one or more match addresses HitXADD may be stored until the RHR signal indicates a targeted refresh operation.

The refresh state control 536 may receive the auto-refresh signal AREF, and may provide the row hammer refresh RHR signal, the internal refresh signal IREF, or the SKIP signal (e.g., or deactivate both of the RHR and IREF signals). The RHR signal may indicate that a targeted refresh operation should take place (e.g., that one or more victim rows associated with the identified aggressor HitXADD should be refreshed). The IREF signal may indicate that an auto-refresh operation should occur. The SKIP signal (e.g., or deactivation of both the RHR and IREF signals) may indicate a skipped refresh operation should occur. The refresh state control 536 may use internal logic to provide the RH R signal. In some embodiments, the refresh state control 536 may include a counter and may provide the SKIP signal or the RHR signal based on certain number of activations of AREF. In some examples, the SKIP and RHR signals have be associated with different counters. The counter (or counters) may be initialized to a particular value (e.g., when the memory is powered on). The particular value may vary from refresh control circuit to refresh control circuit between banks of a memory die and/or may vary between different memory die of a memory package or memory module.

The refresh state control 536 may provide the IREF signal to control the timing of refresh operations. In some embodiments, the refresh state control 536 may activate the IREF signal multiple times for each activation of the refresh signal AREF. In some embodiments, the IREF signal may be used as a refresh pump signal to control the activations of refresh pumps. In some embodiments, each activation of the AREF signal may be associated with a number of activations of the IREF signal, which may be associated with a number of refresh operations, including a mix of targeted refresh operations, skipped refresh operations, and auto-refresh operations. For example, each activation of the IREF signal may be associated with a refresh operation on the refresh address RXADD, while the state of the RHR signal may determine if the refresh address RXADD is associated with an auto-refresh operation or a targeted refresh operation and the state of the SKIP signal may determine if the refresh address RXADD is associated with an auto-refresh operation or a skipped refresh operation. In some embodiments, the IREF signal may be used to indicate that an auto-refresh operation should occur, the RHR signal is used to indicate that a targeted refresh operation should occur, and the SKIP signal is used to indicate that no refresh operation should occur. For example, the SKIP, RHR, and IREF signals may be generated such that they are not active at the same time (e.g., are not ALL at a high logic level at the same time), and each activation of the SKIP signal may be associated with a skipped refresh operation, each activation of the IREF signal may be associated with an auto-refresh operation, and each activation of the RHR signal may be associated with a targeted refresh operation.

In some embodiments, the refresh state control 536 may count activations of the IREF signal and use the count of activations (e.g., the pumps) of the IREF signal to determine when the SKIP signal or the RHR signal should be provided. The counter may initialize to a different value for different refresh control circuits 516, in some examples. In other examples, the counter may initialize to a same value within a die. In some embodiments, the refresh state control 536 may receive one or more signals from a refresh stagger circuit 535 configured to direct the different refresh state controllers 536 to provide the SKIP signal or the RHR signal. In either of these manners skipped or targeted refresh operations and auto-refresh operations may be staggered between banks of a die, or between die of a memory package.

The refresh address generator 539 may receive the row hammer refresh RHR signal and the match address HitXADD. The match address HitXADD may represent an aggressor row. The refresh address generator 539 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 539 may determine the value of the refresh address RXADD based on the RHR signal and, in some examples, the SKIP signal. In some embodiments, when the RHR signal (and the SKIP signal) are not active, the refresh address generator 539 may provide one of a sequence of auto refresh addresses as the refresh address RXADD. When the RHR signal is active (and the SKIP signal is not active), the refresh address generator 539 may provide a targeted refresh address, such as a victim address, as the refresh address RXADD.

The row decoder 508 may perform one or more operations on the memory army (not shown) based on the received signals and addresses. For example, responsive to the activation signal ACT and the row address XADD (and the IREF, SKP, and/or RHR signals being at a low logic level), the row decoder 508 may direct one or more access operations (for example, a read operation) on the specified row address XADD. Responsive to the RHR signal being active, the row decoder 508 may refresh the refresh address RXADD.

Figure 6:
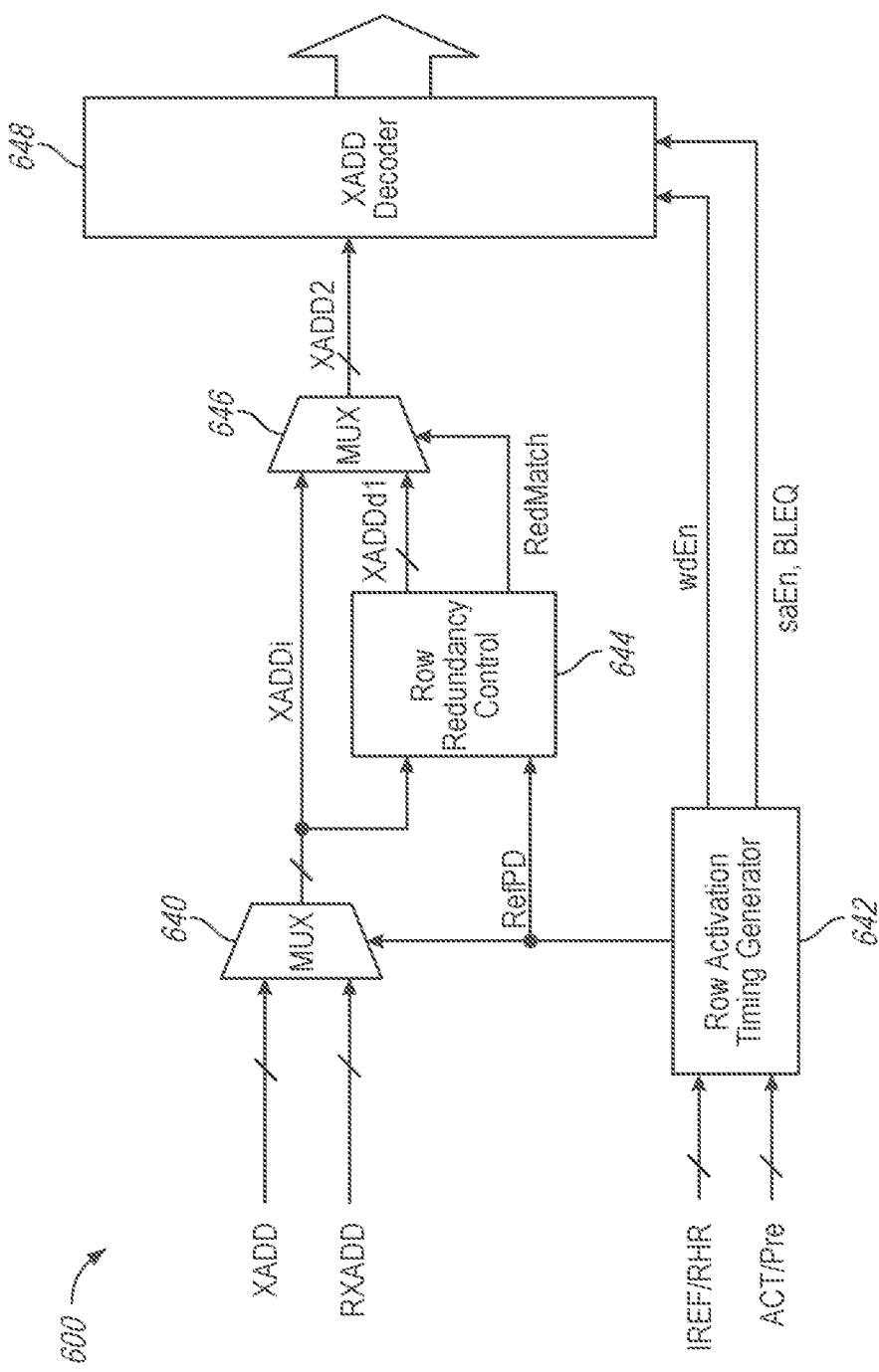
FIG. 6 is a block diagram of a row decoder according to an embodiment of the present disclosure.

FIG. 6 is a block diagram of a row decoder 600 according to an embodiment of the present disclosure. The row decoder 600 may be included in the row decoder 108 of FIG. 1 in some embodiments of the disclosure. The row decoder 600 may determine whether to activate a word line of the memory bank (e.g., a bank of memory array 118 of FIG. 1) corresponding to the row address XADD or the refresh address RXADD.

As shown in FIG. 6, the row decoder 600 is provided with a row activation timing generator 642, which receives the internal refresh signal IREF and the row hammer refresh RHR signal, the active signal ACT, and the pre-charge signal Pre and provides a state signal RefPD, a word-line actuation signal wdEn, a sense-amplifier actuation signal saEn, and a bit-line equalize signal BLEQ. In some embodiments, the signals IREF and RHR may be the auto-refresh signal AREF. The state signal RefPD is supplied to a multiplexer 640, which selects one of the row address XADD or the refresh address RXADD. An address XADDi selected by the multiplexer 640 is supplied to a row redundancy control circuit 644. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 646; wherein, if the hit signal RedMatch is not activated, the address XADDi is selected; and, if the hit signal RedMatch is activated, the address XADDd1 is selected. The selected address XADD2 is supplied to an X address decoder 648. The X address decoder 648 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

Figure 7:
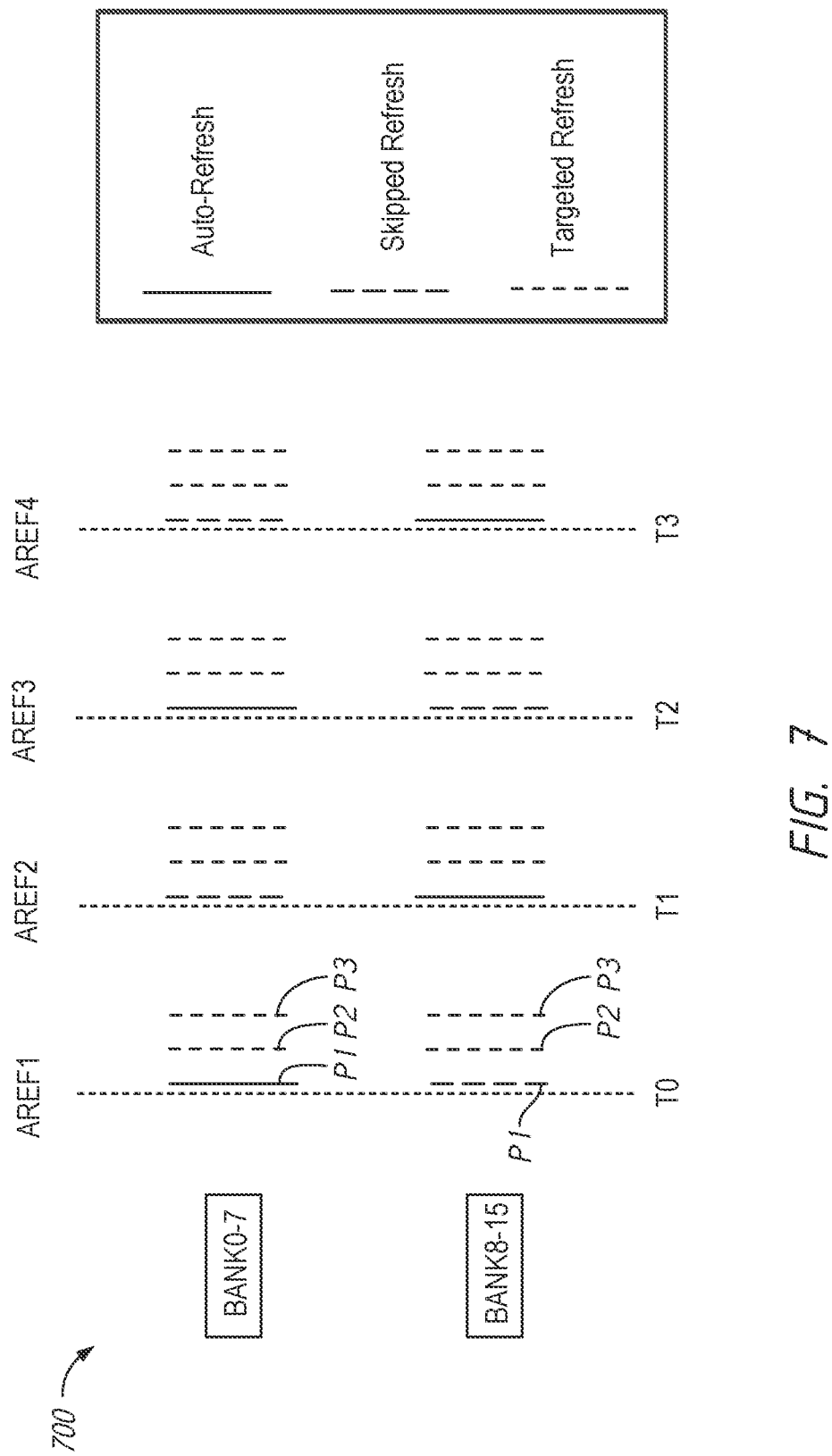
FIG. 7 is an exemplary timing diagram of refresh operations in a memory device according to an embodiment of the present disclosure.

FIG. 7 is an exemplary timing diagram of refresh operations in a memory device according to an embodiment of the present disclosure. The timing diagram 700 shows refresh operations over time (along the x-axis) for memory banks BANK0-15. The memory banks may be the memory banks BANK0-N described with reference to the memory array 112 of FIG. 1 or the memory banks 332(0)-(15) of FIG. 3. The timing diagram 700 shows an example of how skipped refresh operations may be staggered between the memory banks BANK0-15. Other patterns of staggering skipped refresh operations between more or fewer banks may be used in other examples.

The timing diagram 700 shows an example embodiment where four refresh operations are performed responsive to each activation of the refresh signal AREF. In particular, responsive to each activation of AREF, there may be three pumps (e.g., activations of a pump signal in each refresh control circuit), and each of the pumps may be associated with either a skipped refresh operation, an auto-refresh operation, or a targeted refresh operation. The pumps are represented in timing diagram 700 by the vertical lines, with line patterns identifying a type of refresh operation. The pumps are in groups of three to represent the three pumps per AREF activation. Thus, there is an activation of AREF for each group of pumps. The solid lines represent an auto-refresh operation, the medium dashed lines represent a skipped refresh operation, and the longer dashed lines represent a targeted refresh operation. As discussed herein, more wordlines may be simultaneously refreshed in a bank during an auto-refresh operation than during a targeted refresh operation and thus an auto-refresh operation may draw more power than a targeted refresh operation. No wordlines may be refreshed during a skipped refresh operation.

A given bank may perform a refresh operation responsive to each of the pumps. Since the banks produce the pumps responsive to a refresh signal (e.g., AREF) that they receive in common, the pumps may generally be synchronized. Thus, each of the memory banks BANK0-15 may simultaneously perform a first pump, then simultaneously perform a second pump, etc. In response to each of the pumps, each of the banks may generally perform one of a skipped refresh operation, an auto-refresh operations, or targeted refresh operation. In the example depicted in timing diagram 700, two different refresh operation sequences are depicted for an AREF activation. In a first example sequence, an auto-refresh operation is performed responsive to a first pump, a first targeted refresh operation is performed responsive to a second pump, and a second targeted refresh operation is performed responsive to a third pump. In a second example sequence, a skipped refresh operation is performed responsive to a first pump, a first targeted refresh operation is performed responsive to a second pump, and a second targeted refresh operation is performed responsive to a third pump.

In the example timing diagram 700, each of the memory banks BANK0-15 may alternate between the first example sequence and the second example sequence with each AREF activation. However, among the memory banks BANK0-15 during a single AREF activation, the skipped and auto refresh operations may be staggered between the banks such that a first group of memory banks of the memory banks BANK0-15 perform the auto-refresh operation contemporaneous with a second group of memory banks of the memory banks BANK0-15 performing the skipped refresh operation. For example, during the AREF activation received at time T0, the memory banks BANK0-7 may perform the first example sequence (e.g., auto-refresh, first targeted refresh, second targeted refresh), while the memory banks BANK8-15 perform the second example sequence (e.g., skipped refresh, first targeted refresh, second targeted refresh). During the AREF activation received at time T1, the memory banks BANK0-7 may perform the second example sequence (e.g., skipped refresh, first targeted refresh, second targeted refresh), while the memory banks BANK8-15 perform the first example sequence (e.g., auto-refresh, first targeted refresh, second targeted refresh). This two AREF activation cycle or pattern may repeat every two AREF activations (e.g., starting against at time T2, etc.) in the example timing diagram 700. By only performing the auto-refresh on half of the memory banks BANK0-15 at a given time, the peak current draw may be reduced as compared with implementations where all of the memory banks perform the auto-refresh operations contemporaneously.

The memory banks BANK0-15 of FIG. 7 are shown as having a refresh cycle with the same number of pumps produced in response to each AREF. In some embodiments, the refresh cycle may be longer or shorter than the number of pumps produced responsive to each AREF. Similarly, the example timing diagram 700 of FIG. 7 shows that each group of pumps includes a mix of targeted refresh operations and either a skipped or an auto-refresh operation. In some embodiments, a bank may perform only one type of refresh operations responsive to a given AREF. The first and second example sequences, and the repeating cycle every two AREF activations depicted in FIG. 7 are exemplary. It is appreciated that, without departing from the scope of the disclosure, more than two refresh operation sequences (e.g., any number, such as 3, 4, 6, 8, 16, 32, etc.) may be implemented for a given AREF activation, that each AREF activation may include more than three pumps (e.g., 4, 5, 6, etc.), and/or that the repeating cycle may be implemented to occur after more than two AREF activations (e.g., after any number, such as 3, 4, 6, 8, 16, 32, etc.).

Figure 8:
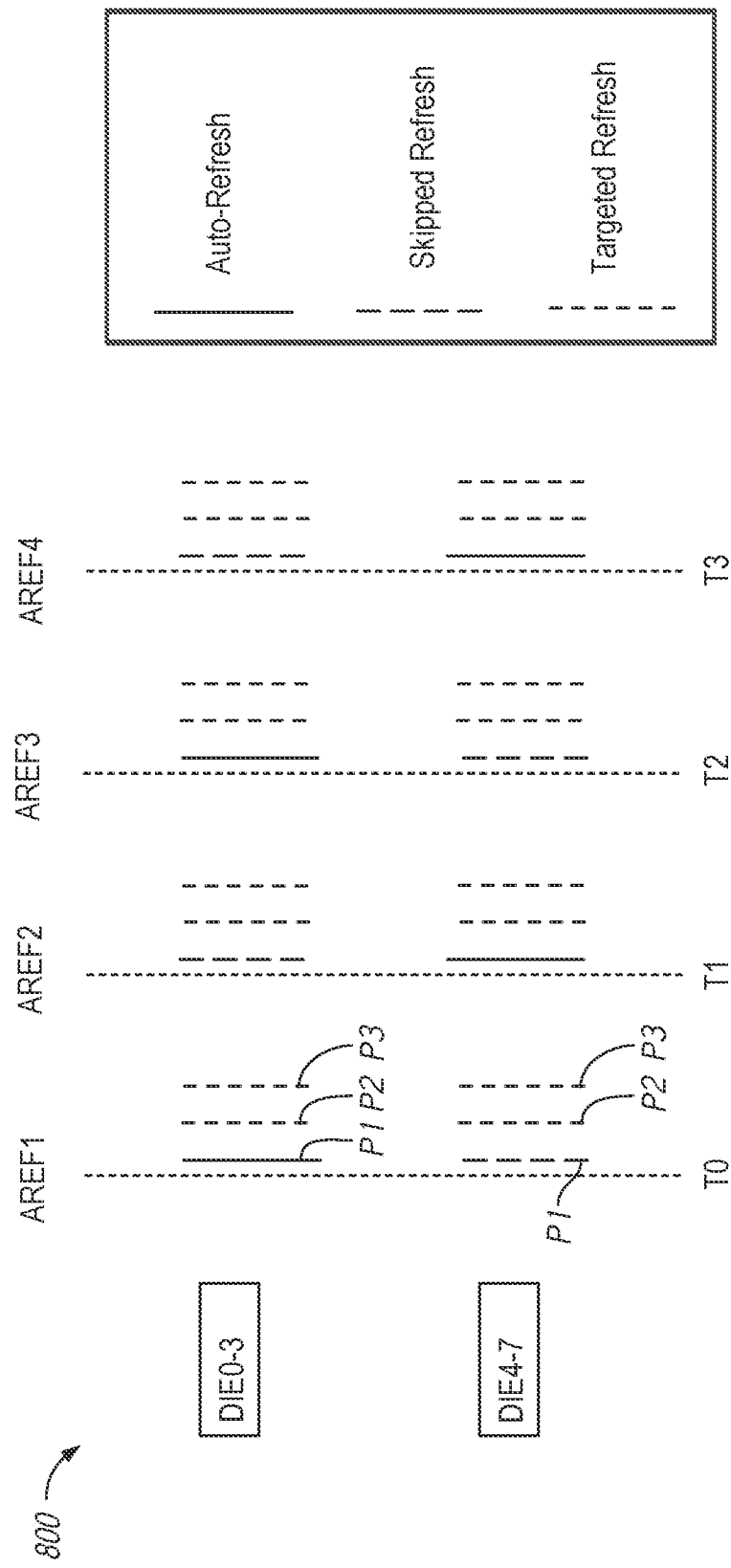
FIG. 8 is an exemplary timing diagram of refresh operations in a memory package or module according to an embodiment of the present disclosure.

FIG. 8 is an exemplary timing diagram 800 of refresh operations in a memory package or module according to an embodiment of the present disclosure. The timing diagram 800 shows refresh operations over time (along the x-axis) for memory dies DIE0-7. The memory dies DIE0-7 may be dies in the stack 125 described with reference to the semiconductor device 100 of FIG. 1, the master die 228 and/or the slave dies 229A-C of FIG. 2, and/or the memory packages 425(0)-(8) of the memory module 400 of FIG. 4. The timing diagram 800 shows an example of how skipped refresh operations may be staggered between the memory dies DIE0-7. Other patterns of staggering skipped refresh operations between more or fewer memory dies may be used in other examples.

The timing diagram 800 shows an example embodiment where three refresh operations are performed responsive to each activation of the refresh signal AREF. In particular, responsive to each activation of AREF, there may be three pumps (e.g., activations of a pump signal in each refresh control circuit), and each of the pumps may be associated with either a skipped refresh operation, an auto-refresh operation, or a targeted refresh operation. The pumps are represented in timing diagram 800 by the vertical lines, with line patters identifying a type of refresh operation. The pumps are in groups of three to represent the three pumps per AREF activation. Thus, there is an activation of AREF for each group of pumps. The solid lines represent an auto-refresh operation, the medium dashed lines represent a skipped refresh operation, and the longer dashed lines represent a targeted refresh operation. As discussed herein, more wordlines may be simultaneously refreshed in a bank during an auto-refresh operation than during a targeted refresh operation and thus an auto-refresh operation may draw more power than a targeted refresh operation. No wordlines may be refreshed during a skipped refresh operation.

A given memory die of the memory dies DIE0-7 may perform a refresh operation responsive to each of the pumps. Since the memory dies DIE0-7 produce the pumps responsive to a refresh signal (e.g., AREF) that they receive in common, the pumps may generally be synchronized. Thus, each of the memory dies DIE0-7 may simultaneously perform a first pump, then simultaneously perform a second pump, etc. In response to each of the pumps, each of the memory dies DIE0-7 may generally perform one of a skipped refresh operation, an auto-refresh operations, or targeted refresh operation. In the example depicted in timing diagram 800, two different refresh operation sequences are depicted for an AREF activation. In a first example sequence, an auto-refresh operation is performed responsive to a first pump, a first targeted refresh operation is performed responsive to a second pump, and a second targeted refresh operation is performed responsive to a third pump. In a second example sequence, a skipped refresh operation is performed responsive to a first pump, a first targeted refresh operation is performed responsive to a second pump, and a second targeted refresh operation is performed responsive to a third pump.

In the example timing diagram 800, each of the memory dies DIE0-7 may alternate between the first example sequence and the second example sequence with each AREF activation. However, among the memory dies DIE0-7 during a single AREF activation, the skipped and auto refresh operations may be staggered between the memory dies DIE0-7 such that a first group of memory dies of the memory dies DIE0-7 perform the auto-refresh operation contemporaneous with a second group of memory dies of the memory dies DIE0-7 performing the skipped refresh operation. For example, during the AREF activation received at time T0, the memory dies DIE0-3 may perform the first example sequence (e.g., auto-refresh, first targeted refresh, second targeted refresh), while the memory dies DIE4-7 perform the second example sequence (e.g., skipped refresh, first targeted refresh, second targeted refresh). During the AREF activation received at time T1, the memory dies DIE0-3 may perform the second example sequence (e.g., skipped refresh, first targeted refresh, second targeted refresh), while the memory dies DIE4-7 perform the first example sequence (e.g., auto-refresh, first targeted refresh, second targeted refresh). This two AREF activation cycle or pattern may repeat every two AREF activations (e.g., starting against at time T2, etc.) in the example timing diagram 800. By only performing the auto-refresh on a subset of the memory dies DIE0-7 at a given time, the peak current draw may be reduced as compared with implementations where all of the memory banks perform the auto-refresh operations contemporaneously.

The memory dies DIE0-7 of FIG. 8 are shown as having a refresh cycle with the same number of pumps produced in response to each AREF. In some embodiments, the refresh cycle may be longer or shorter than the number of pumps produced responsive to each AREF. Similarly, the example timing diagram 800 of FIG. 8 shows that each group of pumps includes a mix of targeted refresh operations and either a skipped or an auto-refresh operation. In some embodiments, a memory die may perform only one type of refresh operations responsive to a given AREF. The first and second example sequences, and the repeating cycle every two AREF activations depicted in FIG. 8 are exemplary. It is appreciated that, without departing from the scope of the disclosure, more than two refresh operation sequences (e.g., any number, such as 3, 4, 6, 8, 16, 32, etc.) may be implemented for a given AREF activation, that each AREF activation may include more than three pumps (e.g., 4, 5, 6, etc.), and/or that the repeating cycle may be implemented to occur after more than two AREF activations (e.g., after any number, such as 3, 4, 6, 8, 16, 32, etc.).

While this application has described reducing peak current draw during refresh operations within non-volatile memory architectures, it is appreciated that a similar approach may be implemented in other contexts and in other types of semiconductor devices, including non-volatile memory devices. For example, configuration of other types of periodic maintenance functions within a memory device/package/module may be staggered in a similar fashion to reduce peak power within each device, or device set. Other types of periodic maintenance functions may include error correction code maintenance (e.g., ECC error check and scrub procedures), wear levelling, or other targeted restoring of data within a set of storage array containers after destructive accesses other than row hammer.

Figure 9:
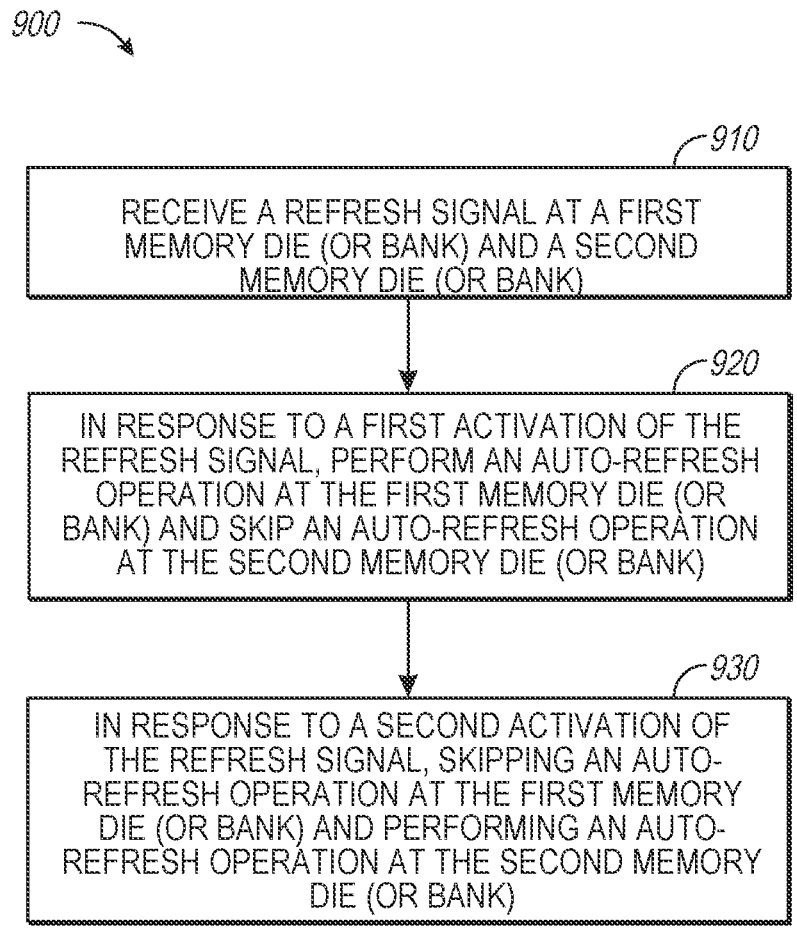
FIG. 9 is a flow diagram of a method to stagger refresh operations, in accordance with an embodiment of the present disclosure.

FIG. 9 is a flow diagram of a method 900 to stagger refresh operations, in accordance with an embodiment of the present disclosure. The method 900 may be performed by circuitry of the semiconductor device 100 of FIG. 1, the memory package 200 of FIG. 2, the memory array 300 of FIG. 3, the memory module 400 of FIG. 4, the refresh stagger circuit 535 and/or the refresh address control circuit 516 of FIG. 5, the row decoder 600 of FIG. 6, or combinations thereof. Note that the method 900 may be performed to stagger auto-refresh operations across different memory die (e.g., in a memory package or module), to stagger auto-refresh operations across different memory banks within a single memory die, or combinations thereof.

The method 900 may include receiving a refresh signal at a first memory die (or bank) and a second memory die (or bank), at 910. In some examples, the first and second memory die include any of the memory die in the stack 125 of FIG. 1, any of the master memory die 228 or the slave memory die 229*a*-*c* of FIG. 2, a memory die in any of the memory packages 425(0)-(8) of FIG. 4, or any combination thereof. In some examples, the first and second memory die may be included in a memory package, such as the memory package 200 of FIG. 2. In some examples, the first and second memory die may be included in a memory module, such as the memory module 400 of FIG. 4. In an embodiment examples, where the method 900 is performed with first and second memory banks, the first and second memory banks may correspond to any of the memory banks BANK0-N (or a respective group of memory cells) of the memory array 118 of FIG. 1, respective memory banks in any one of the master memory die 228 or the slave memory die 229*a*-*c* of FIG. 2, any of the memory banks 332(0)-(15) of FIG. 3, respective memory banks of a memory die in any of the memory packages 425(0)-(8) of FIG. 4, or combinations thereof.

In some examples, the method 900 may include determining, at the first memory die (or the second memory die), whether to perform the auto-refresh operation or to skip the refresh operation in response to an activation of the refresh signal based on an internal setting. The internal setting is programmed in a fuse bank, in an example. In some examples, the determination may include determining a pattern of auto-refresh operations and skipped refresh operations based on the internal setting. The determination may be made via a refresh stagger circuit or a refresh address control circuit, such as the refresh stagger circuit 535 and/or the refresh address control circuit 516 of FIG. 5.

The method 900 may include, in response to a first activation of the refresh signal, performing an auto-refresh operation at the first memory die (or bank) and skipping an auto-refresh operation at the second memory die (or bank), at 920. In some examples, performing the auto-refresh operation at the first memory die includes performing the auto-refresh operation on a plurality of rows of memory cells.

The method 900 may include, in response to a second activation of the refresh signal, skipping an auto-refresh operation at the first memory die (or bank) and performing an auto-refresh operation at the second memory die (or bank), at 930. In some examples, performing the auto-refresh operation at the second memory die includes performing the auto-refresh operation on a plurality of rows of memory cells. In some examples, the method 900 may further include contemporaneously performing a targeted refresh operation at both of the first memory die and the second memory die in response to a third activation of the refresh signal. The method 900 depicted in FIG. 9 is exemplary, and may include additional steps, and the steps may be performed in a different order than depicted.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

The foregoing description of certain embodiments is exemplary in nature and is in no way intended to limit the scope of the disclosure or its applications or uses. In the detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features may not be discussed when they would be apparent to those with skill in the art so as not to obscure the description of embodiments of the disclosure. The foregoing detailed description is therefore not to be taken in a limiting sense, and the scope of the disclosure is defined only by the appended claims.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
 a first memory die comprising a first plurality of rows of memory cells, wherein, responsive to a first activation of a refresh signal, the first memory die is configured to perform an auto-refresh operation on a first subset of the first plurality of rows of memory cells, wherein, responsive to a second activation of the refresh signal, the first memory die is further configured to either perform a first targeted refresh operation on a first row hammer attack victim row of the first plurality of memory cells or skip a refresh operation; and
 a second memory die comprising a second plurality of rows of memory cells, wherein, responsive to the first activation of the refresh signal, the second memory die is configured to either perform a second targeted refresh operation on a second row hammer attack victim row of the second plurality of rows of memory cells or skip a refresh operation, wherein, responsive to the second activation of the refresh signal, the second memory die is further configured to perform an auto-refresh operation on a second subset of the second plurality of rows of memory cells.

2. The apparatus of claim 1, wherein the first memory die and the second memory die are both configured to contemporaneously perform respective targeted refresh operations responsive to a third activation of the refresh signal.

3. The apparatus of claim 1, wherein, responsive to the second activation of the refresh signal, the first memory die is configured to perform the first targeted refresh operation in response to detection of a first row hammer attack associated with the first victim row.

4. The apparatus of claim 3, wherein the first memory die is configured to skip a refresh operation when no row hammer attack is detected.

5. The apparatus of claim 3, wherein the first memory die is configured to detect the first row hammer attack.

6. The apparatus of claim 1, further comprising a memory package that includes the first memory die and the second memory die.

7. The apparatus of claim 1, further comprising a memory module that includes the first memory die and the second memory die.

8. The apparatus of claim 1, wherein the first memory die is configured to determine whether to perform the auto-refresh operation or to either perform the first targeted refresh operation or skip a refresh operation based on an internal setting.

9. The apparatus of claim 8, wherein the first memory die is configured to determine the internal setting is based on a value programmed in a fuse bank.

10. The apparatus of claim 8, wherein the first memory die comprises a refresh address control circuit configured to determine a pattern of auto-refresh operations and targeted or skipped refresh operations based on the internal setting.

11. An apparatus comprising:
a memory array having a plurality of memory banks;
a refresh control circuit configured to receive a refresh signal, wherein, in response to each activation of the refresh signal, the refresh control circuit is configured to cause an auto-refresh operation to be staggered across the plurality of memory banks such that the auto-refresh operation is skipped for a different subset of less than all of the plurality of memory banks for each activation of the refresh signal.

12. The apparatus of claim 11, wherein the refresh control circuit is configured to cause auto-refresh operations to be skipped on the plurality of memory banks at a common frequency.

13. The apparatus of claim 11, wherein the refresh control circuit is configured to cause auto-refresh operations to be skipped for a particular subset of memory banks based on a corresponding counter having a target count value.

14. The apparatus of claim 13, wherein the refresh control circuit is configured to cause auto-refresh operations to be skipped for a second particular subset of memory banks based on a second corresponding counter having a second target count value.

15. The apparatus of claim 13, wherein the refresh control circuit is configured to initialize the counter to and the second counter to different values.

16. The apparatus of claim 13, wherein the refresh control circuit is configured to adjust a count value of the counter in response to activations of the refresh signal.

17. The apparatus of claim 11, wherein, in response to an activation of the refresh signal, the refresh control circuit is configured to cause a particular memory bank of the plurality of memory banks to perform a targeted refresh operation responsive to detection of a row hammer attack associated with the particular memory bank.

18. A method comprising:
receiving a refresh signal at a memory having a memory array with a plurality of memory banks;
in response to a first activation of the refresh signal:
performing an auto-refresh operation on a first subset of less than all of the plurality of memory banks; and
skipping a refresh operation on a second subset of less than all of the plurality of memory banks, wherein the first subset of less than all of the plurality of memory banks and the second subset of less than all of the plurality of memory banks are each mutually exclusive subsets of the plurality of memory banks; and
in response to a second activation of the refresh signal:
performing an auto-refresh operation on the second subset of the plurality of memory banks; and
skipping a refresh operation on the first subset of the plurality of memory banks.

19. The method of claim 18, further comprising skipping the auto-refresh operations on the first subset and the second subset of the plurality of memory banks at a common frequency.

20. The method of claim 18, further comprising in response to a second activation of the refresh signal, skipping the refresh operation on the first subset of the plurality of memory banks when a counter has a target count value.

21. The method of claim 20, further comprising in response to the first activation of the refresh signal, skipping the refresh operation on the second subset of the plurality of memory banks when a second counter has a second target count value.

* * * * *